(12) United States Patent
Tsai et al.

(10) Patent No.: US 10,446,515 B2
(45) Date of Patent: Oct. 15, 2019

(54) SEMICONDUCTOR SUBSTRATE AND SEMICONDUCTOR PACKAGING DEVICE, AND METHOD FOR FORMING THE SAME

(71) Applicant: Advanced Semiconductor Engineering, Inc., Kaohsiung (TW)

(72) Inventors: Li Chuan Tsai, Kaohsiung (TW); Chih-Cheng Lee, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/450,598

(22) Filed: Mar. 6, 2017

(65) Prior Publication Data

US 2018/0254240 A1 Sep. 6, 2018

(51) Int. Cl.
*H01L 23/498* (2006.01)
*H01L 23/00* (2006.01)
*H01L 21/48* (2006.01)

(52) U.S. Cl.
CPC .......... *H01L 24/17* (2013.01); *H01L 21/4846* (2013.01); *H01L 23/49811* (2013.01); *H01L 23/49838* (2013.01); *H01L 24/16* (2013.01); *H01L 2224/02333* (2013.01); *H01L 2224/02335* (2013.01); *H01L 2224/04* (2013.01); *H01L 2224/0401* (2013.01); *H01L 2224/16227* (2013.01); *H01L 2924/014* (2013.01)

(58) Field of Classification Search
CPC ... H01L 23/49811; H01L 24/16; H01L 24/17; H01L 2224/04; H01L 2224/0401; H01L 2224/02333; H01L 2224/0233
See application file for complete search history.

(56) References Cited

U.S. PATENT DOCUMENTS

| | | | |
|---|---|---|---|
| 6,534,723 B1* | 3/2003 | Asai ................ | H01L 23/49811 174/255 |
| 7,005,241 B2 | 2/2006 | Fukase et al. | |
| 7,038,142 B2* | 5/2006 | Abe .................... | H01L 23/142 174/255 |
| 7,427,560 B2* | 9/2008 | Lin ..................... | H01L 21/768 257/E21.597 |
| 9,484,291 B1* | 11/2016 | Dhandapani ........... | H01L 24/11 |
| 2001/0002728 A1 | 6/2001 | Tsukada et al. | |
| 2002/0033412 A1* | 3/2002 | Tung .................... | H01L 24/11 228/215 |
| 2006/0292851 A1* | 12/2006 | Lin .................. | H01L 21/76801 438/618 |

(Continued)

OTHER PUBLICATIONS

Non-Final Office Action for U.S. Appl. No. 15/699,810, dated Sep. 5, 2018, 15 pages.

(Continued)

*Primary Examiner* — FeiFei Yeung Lopez

(74) *Attorney, Agent, or Firm* — Foley & Lardner LLP; Cliff Z. Liu

(57) ABSTRACT

A semiconductor substrate includes a first dielectric layer, a first patterned conductive layer disposed in the first dielectric layer, a second dielectric layer disposed on the first dielectric layer, and a first bump pad disposed in the second dielectric layer. The first bump pad is electrically connected to the first patterned conductive layer, and the first bump pad has a curved surface surrounded by the second dielectric layer.

18 Claims, 28 Drawing Sheets

(56) References Cited

U.S. PATENT DOCUMENTS

| | | | |
|---|---|---|---|
| 2008/0202803 A1 | 8/2008 | Nagase et al. | |
| 2009/0038834 A1* | 2/2009 | Itoh | C08F 283/00 174/258 |
| 2011/0308849 A1* | 12/2011 | Kondo | H01L 23/49822 174/260 |
| 2012/0006592 A1* | 1/2012 | Ouchi | H01L 23/49816 174/267 |
| 2012/0067635 A1* | 3/2012 | Nang | B23K 1/0016 174/260 |
| 2014/0332252 A1 | 11/2014 | Lin | |
| 2014/0360767 A1* | 12/2014 | Terui | H01L 24/19 174/261 |
| 2015/0115469 A1 | 4/2015 | Lee et al. | |
| 2017/0069558 A1* | 3/2017 | Bang | H01L 23/3128 |

OTHER PUBLICATIONS

Final Office Action for U.S. Appl. No. 15/699,810, dated Jan. 30, 2019, 17 pages.

\* cited by examiner

SEMICONDUCTOR SUBSTRATE AND SEMICONDUCTOR PACKAGING DEVICE, AND METHOD FOR FORMING THE SAME

BACKGROUND

In packaging integrated circuit (IC) chips, solder joining is one of the commonly used methods for bonding IC chips to package substrates. In packaging processes, a copper pillar of a semiconductor die (or chip) may be mounted on a bump pad of a package substrate. When a bump pitch of the semiconductor package is small, the copper pillar of a die may undesirably contact a metal line/trace adjacent to a bump pad (e.g. conductive traces run through two adjacent pads) on the semiconductor substrate when the die is bonded to the semiconductor substrate. In addition, in a semiconductor package, a bump pad can be disposed on a metal line. When the semiconductor package is small, the bump pad may deviate from a preferred position on the metal line. The deviated bump pad may undesirably contact a metal line adjacent to the bump pad. Accordingly, there is a need to provide a bump pad and/or related process that solves the above problem.

SUMMARY

In some embodiments, according to one aspect, a semiconductor substrate includes a first dielectric layer, a first patterned conductive layer, a second dielectric layer, and a first bump pad. The first patterned conductive layer is disposed in the first dielectric layer. The second dielectric layer is disposed on the first dielectric layer. The first bump pad is disposed in the second dielectric layer. The first bump pad is electrically connected to the first patterned conductive layer. The first bump pad has a curved surface surrounded by the second dielectric layer.

In some embodiments, according to another aspect, a semiconductor package device includes a semiconductor substrate and a die. The semiconductor substrate includes a first dielectric layer, a patterned conductive layer disposed in the first dielectric layer, a second dielectric layer disposed on the first dielectric layer, and a bump pad disposed in the second dielectric layer. The bump pad is electrically connected to the patterned conductive layer, and the bump pad has a curved surface surrounded by the second dielectric layer. The die is electrically connected to the bump pad.

In some embodiments, according to another aspect, a method of forming a semiconductor includes providing a carrier, forming a first photosensitive layer on a surface of the carrier, exposing the first photosensitive layer to light to form a first patterned photosensitive layer, forming a second photosensitive layer on the first patterned photosensitive layer, exposing the second photosensitive layer to light to form a second patterned photosensitive layer, etching the first patterned photosensitive layer and the second patterned photosensitive layer to form a first hole in the first patterned photosensitive layer and a second hole in the second patterned photosensitive layer, wherein the second hole is aligned with the first hole, and disposing a conductive material into the first hole and the second hole to form a bump pad and a conductive layer respectively.

BRIEF DESCRIPTION OF THE DRAWINGS

Aspects of the present disclosure are best understood from the following detailed description when read with the accompanying figures. It is noted that various features may not be drawn to scale. In fact, the dimensions of the various features may be arbitrarily increased or reduced for clarity of discussion.

DETAILED DESCRIPTION

Figure 1:
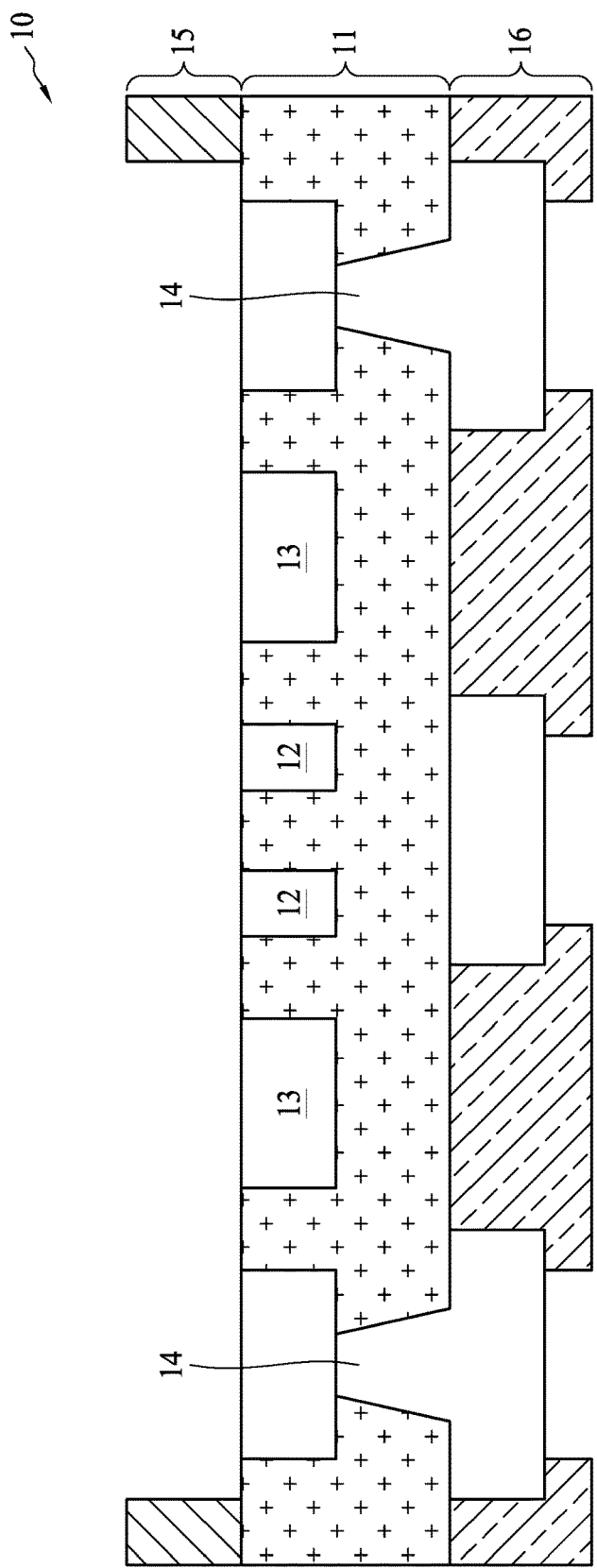
FIG. 1 is a cross-sectional diagram illustrating some embodiments of a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

The numerical ranges and parameters setting forth the broad scope of the disclosure are approximations, and the numerical values set forth in the specific examples may be reported as precisely as possible. Some numerical values, however, may contain certain errors necessarily resulting from the standard deviation found in the respective testing measurements. Also, as used herein, the term "about" generally means within ±10%, ±5%, ±1%, or ±0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

FIG. 1 is a cross-sectional diagram illustrating some embodiments of a semiconductor substrate 10. The semiconductor substrate 10 includes a dielectric layer 11, a plurality conductive traces 12, a plurality of pads 13, a plurality of conductive vias 14, a first protection layer 15, and a second protection layer 16. The semiconductor substrate 10 is configured to be a package substrate for a semiconductor die (not shown). The pads 13 are arranged to mount to a plurality of copper pillars of the semiconductor die respectively. The conductive traces 12 and the pads 13 are embedded in the dielectric layer 11. In the semiconductor substrate 10, the conductive trace 12 and the pads 13 are exposed from a surface of the dielectric layer 11. Moreover, a surface of the conductive trace 12, the surface of the pads 13, and the surface of the dielectric layer 11 are substantially coplanar. However, when a solder bump of a die is bonded to one of the pads 13 of the semiconductor substrate 10, the solder bump of the die may undesirably contact the trace 12 adjacent to the pad 13 when the bump pitch between the two pads 13 is small.

Figure 2:
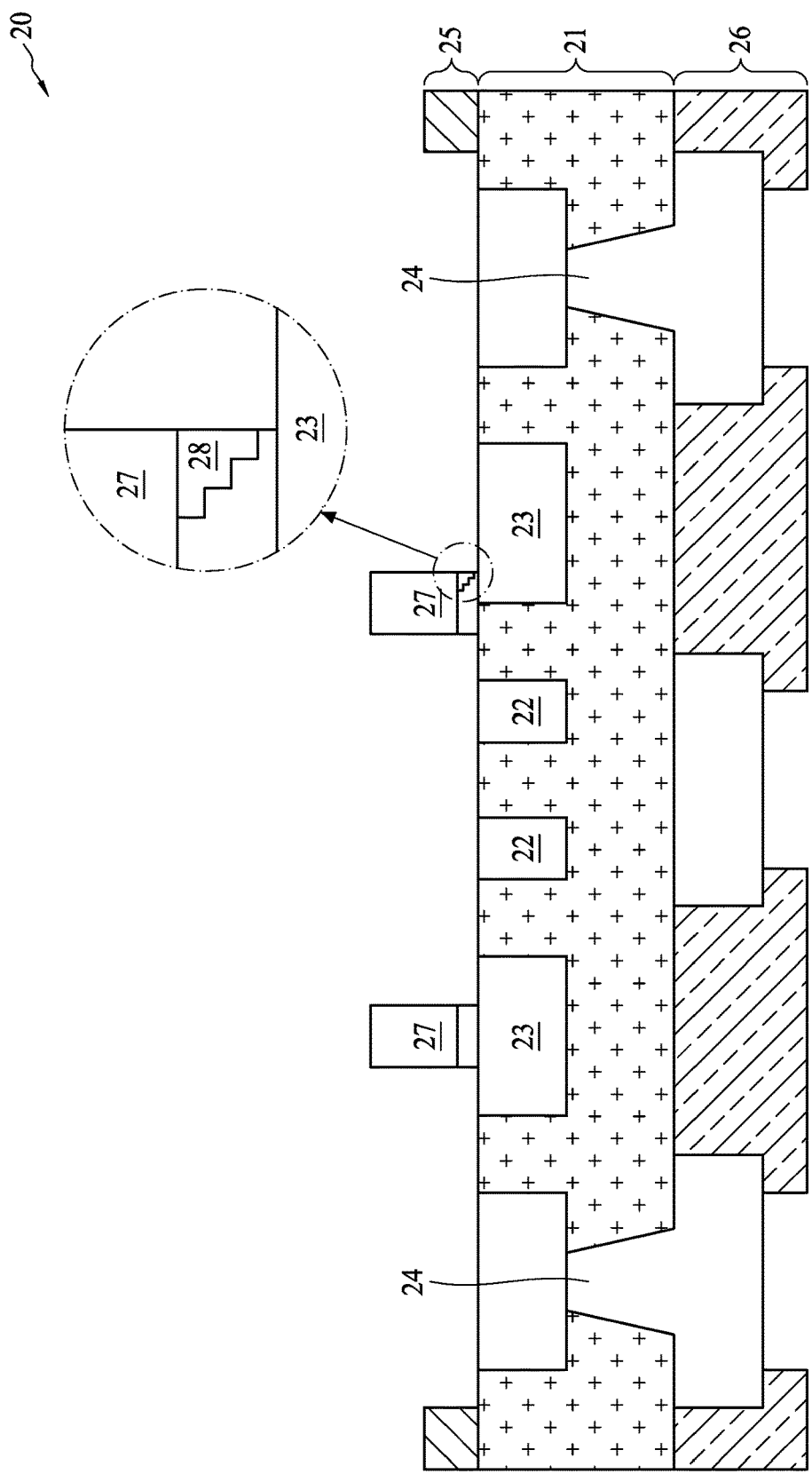
FIG. 2 is a cross-sectional diagram illustrating some embodiments of another semiconductor substrate.

FIG. 2 is a cross-sectional diagram illustrating some embodiments of a semiconductor substrate 20. The semiconductor substrate 20 includes a dielectric layer 21, a plurality conductive traces 22, a plurality of pads 23, a plurality of conductive vias 24, a first protection layer 25, a second protection layer 26, and a plurality of posts 27. The semiconductor substrate 20 is configured to be a package substrate for a semiconductor die (not shown). The posts 27 are arranged to mount to a plurality of solder bump of the semiconductor die respectively. The conductive traces 22 and the pads 23 are embedded in the dielectric layer 21. The width of the post 27 is smaller than the width of at least one of the pads 23. In the semiconductor substrate 20, the posts 27 are disposed on the pads 23 respectively. The posts 27 are protruded from the surfaces of the conductive trace 22, the pads 23, and the dielectric layer 21. However, during a fabrication process, the post 27 may be imprecisely disposed on the corresponding pad 23. In other words, the post 27 may shift from a preferred position and may disconnect from the corresponding pad 23 (e.g. may not be electrically connected to the corresponding pad 23). For example, as shown in FIG. 2, a post 27 on the right side of the semiconductor substrate 20 is shifted from the center of the corresponding pad 23, and cracks 28 may occur on the post 27. The post 27 may also be shifted so as to undesirably contact the trace 22 adjacent to the pad 23.

Figure 3:
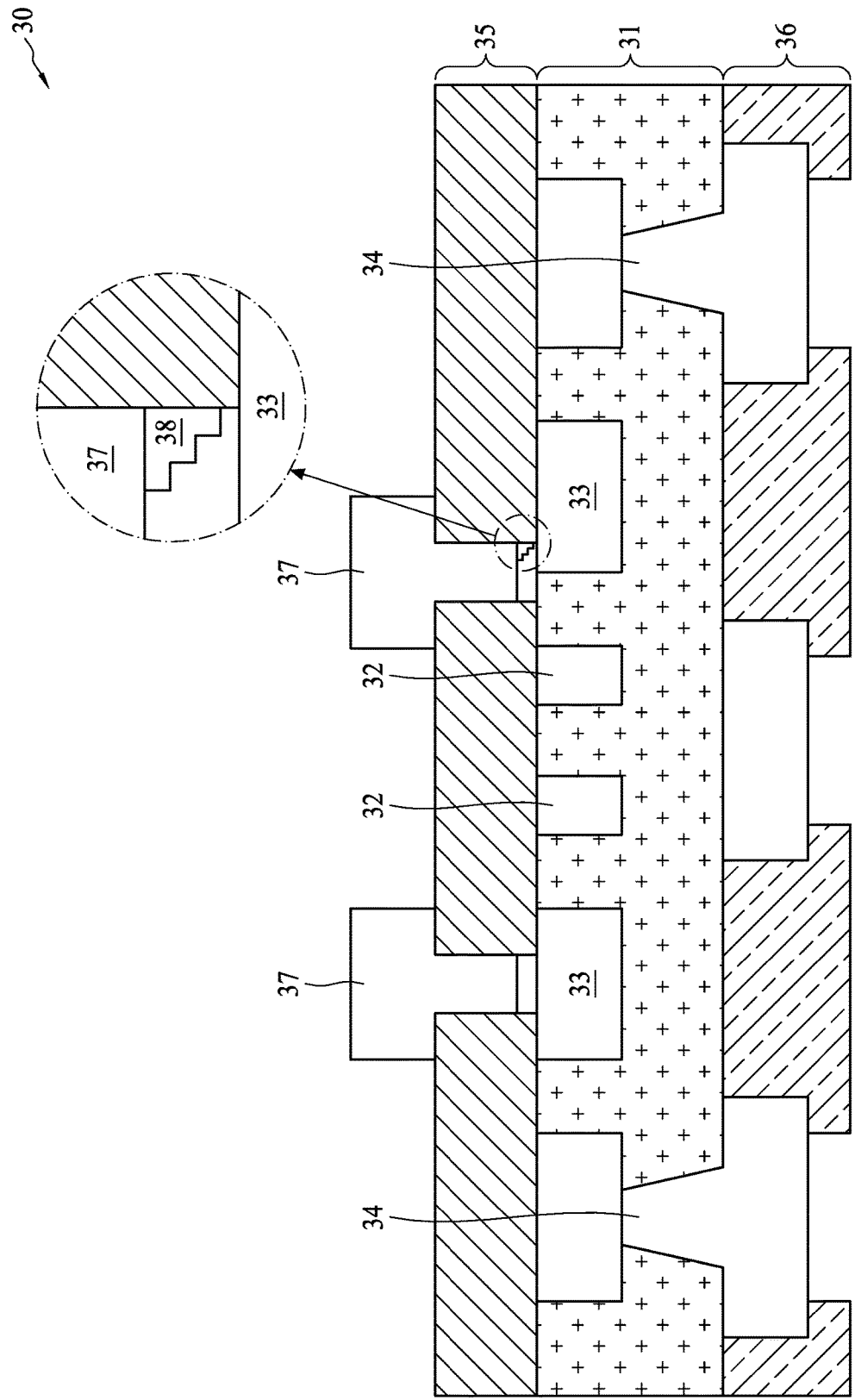
FIG. 3 is a cross-sectional diagram illustrating some embodiments of another semiconductor substrate.

FIG. 3 is a cross-sectional diagram illustrating some embodiments of a semiconductor substrate 30. The semiconductor substrate 30 includes a dielectric layer 31, a plurality conductive traces 32, a plurality of pads 33, a plurality of conductive vias 34, a first protection layer 35, a second protection layer 36, and a plurality of posts 37. The semiconductor substrate 30 is configured to be a package substrate for a semiconductor die (not shown). The posts 37 are arranged to mount to a plurality of solder bump of the semiconductor die respectively. The conductive traces 32 and the pads 33 are embedded in the dielectric layer 31. The first protection layer 35 is disposed on the dielectric layer 31, and covers the conductive traces 32, and at least a portion of the pads 33. The posts 37 are disposed on the pads 33 respectively. The lower portion of the post 37 is surrounded by the first protection layer 35, and the upper portion of the post 37 is protruded from the first protection layer 35. The width of the upper portion is greater than that of the lower portion of the post 37. However, during the fabrication process, the lower portion of the post 37 may be imprecisely disposed on the corresponding pad 33. In other words, the lower portion of post 37 may be shifted from a preferred position and disconnect from the corresponding pad 33. For example, as shown in FIG. 3, the post 37 on the right side of the semiconductor substrate 30 shifts from the center of the corresponding pad 33, and cracks 38 may occur on the post 37. The lower portion of post 37 may also undesirably contact the trace 32 adjacent to the pad 33.

Figure 4:
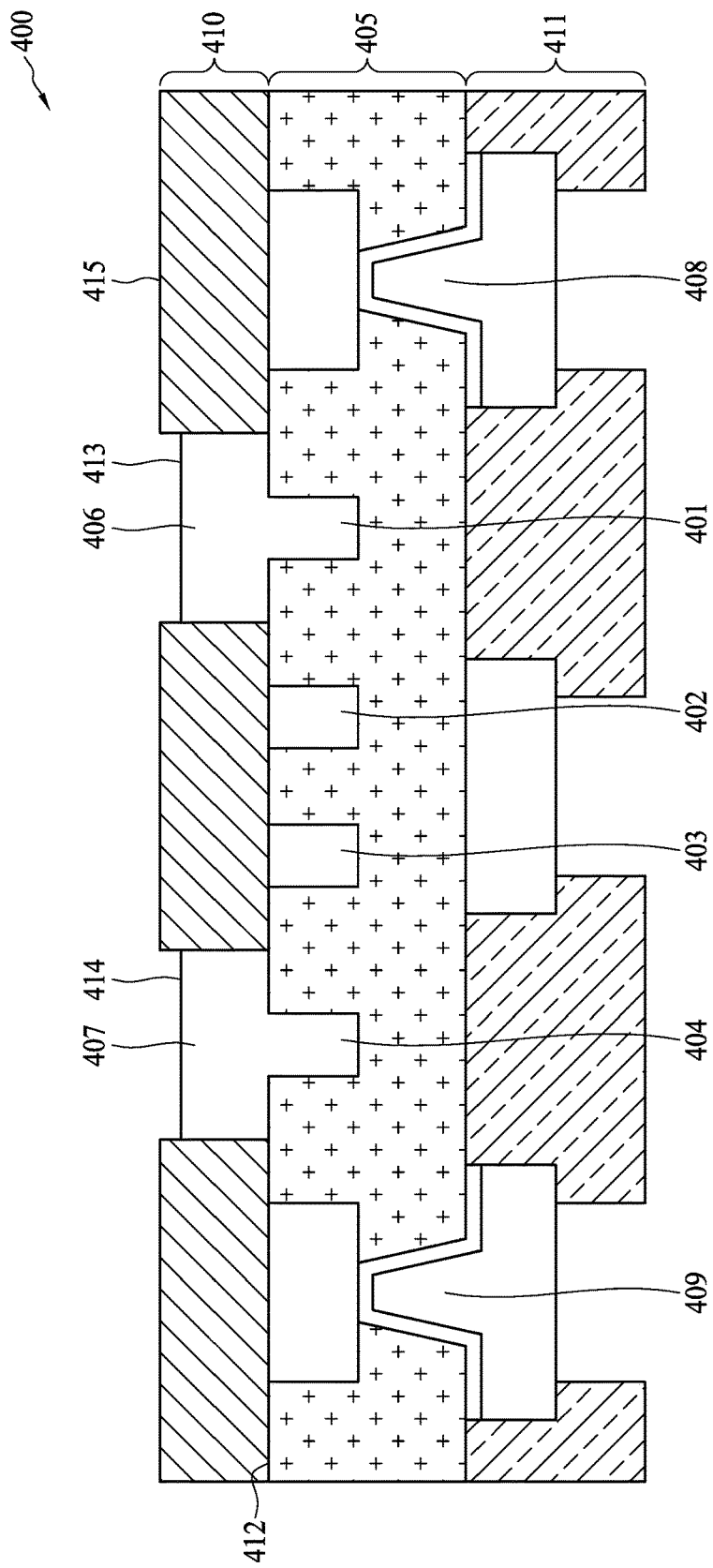
FIG. 4 is a cross-sectional diagram illustrating a semiconductor substrate in accordance with some embodiments.

FIG. 4 is a cross-sectional diagram illustrating a semiconductor substrate 400 in accordance with some embodiments. The semiconductor substrate 400 is configured to be a package substrate for a semiconductor die (not shown). For brevity. the semiconductor substrate 400 shown in FIG. 4 is just a portion of the package substrate. As shown in FIG. 4, the semiconductor substrate 400 includes a first patterned conductive layer 401, a second patterned conductive layer 402, a third patterned conductive layer 403, a fourth patterned conductive layer 404, a first dielectric layer 405, a first bump pad 406, a second bump pad 407, a first conductive via 408, a second conductive via 409, a second dielectric layer 410, and a third dielectric layer 411. The first bump pad 406 and the second bump pad 407 are arranged to mount to a first copper pillar of the semiconductor die with solder material and a second copper pillar of the semiconductor die with solder material, respectively.

The first patterned conductive layer 401, the second patterned conductive layer 402, the third patterned conductive layer 403, and the fourth patterned conductive layer 404 are embedded in the first dielectric layer 405. The first bump pad 406 and the second bump pad 407 are embedded in the second dielectric layer 410. More specifically, the first patterned conductive layer 401, the second patterned conductive layer 402, the third patterned conductive layer 403, and the fourth patterned conductive layer 404 are coplanar to a surface 412 of the first dielectric layer 405 (or the interface between the first dielectric layer 405 and the second dielectric layer 410). An exposed surface 413 of the first bump pad 406 (e.g. exposed from the second dielectric layer 410) and an exposed surface 414 of the second bump pad 407 (e.g. exposed from the second dielectric layer 410) are substantially coplanar to an exposed surface 415 of the second dielectric layer 410 (e.g. a top surface, as shown in FIG. 4). According to some embodiments, the exposed surface 413 of the first bump pad 406 and the exposed surface 414 of the second bump pad 407 are not protruded from, not higher than, and/or lower than the exposed surface 415 of the second dielectric layer 410. According to some embodiments, the exposed surface 413 of the first bump pad 406 and the exposed surface 414 of the second bump pad 407 are recessed from the exposed surface 415 of the second dielectric layer 410.

The first bump pad 406 and the second bump pad 407 are electrically connected to the first patterned conductive layer 401 and the fourth patterned conductive layer 404 respectively. The first patterned conductive layer 401 and the first bump pad 406 are configured as an integrated component, and the fourth patterned conductive layer 404 and the second bump pad 407 are configured as another integrated component. According to some embodiments, the first patterned conductive layer 401 and the first bump pad 406 are configured as a substantially t-shaped pad, and the fourth patterned conductive layer 404 and the second bump pad 407 are configured as another substantially t-shaped pad.

In addition, the materials of the second dielectric layer 410 and the third dielectric layer 411 may be different or the same. According to some embodiments, the materials of the second dielectric layer 410 and the third dielectric layer 411 include photosensitive dielectric material, which can help to ensure that warpages of the second dielectric layer 410 and the third dielectric layer 411 are balanced during a heating process.

Figure 5:
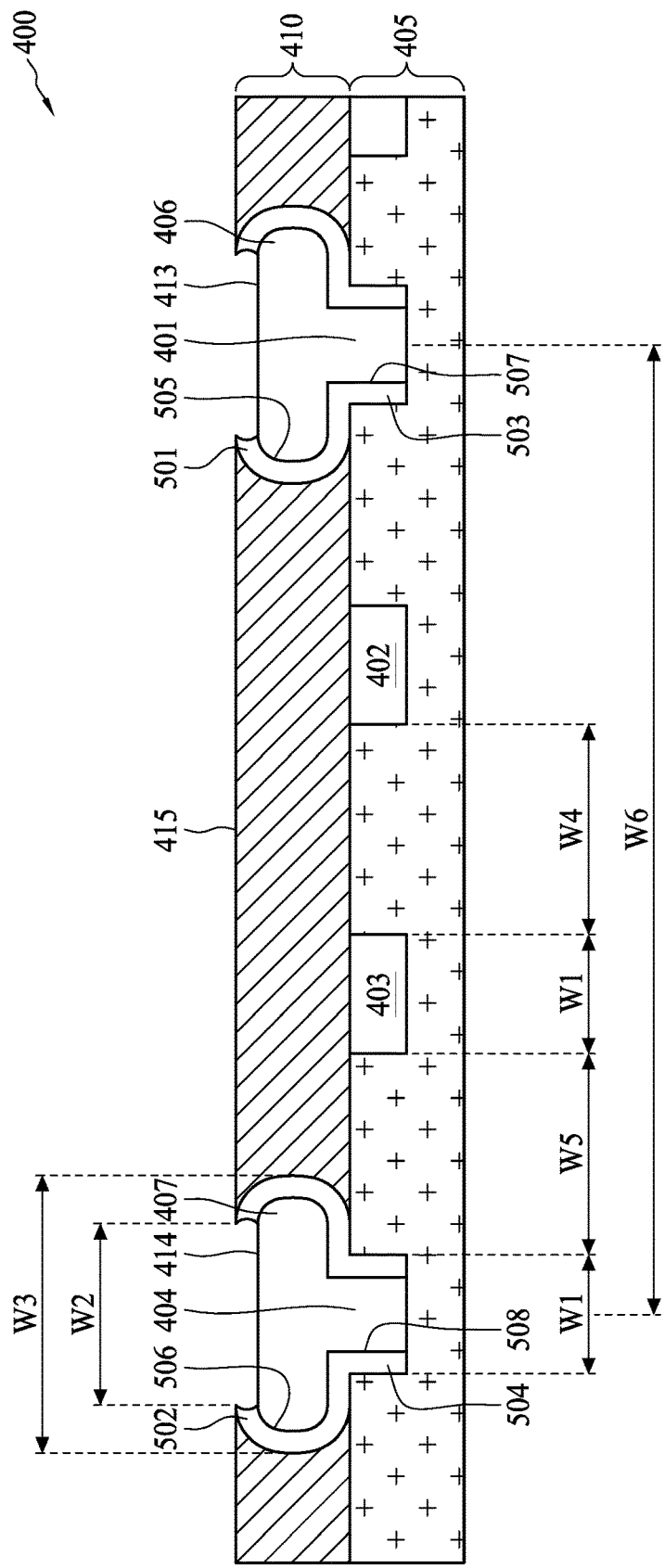
FIG. 5 is a cross-sectional diagram illustrating an enlarged portion of the semiconductor substrate shown in FIG. 4 in accordance with some embodiments.

FIG. 5 is a cross-sectional diagram illustrating an enlarged portion of the semiconductor substrate 400 in accordance with some embodiments. The enlarged portion focuses on the structures of the first patterned conductive layer 401, the second patterned conductive layer 402, the third patterned conductive layer 403, the fourth patterned conductive layer 404, the first bump pad 406, and the second bump pad 407. The first bump pad 406 and the second bump pad 407 have a first curved surface 505 (e.g. a lateral surface) and a second curved surface 506 (e.g. a lateral surface), respectively, surrounded by the second dielectric layer 410. It is noted that, in the depicted embodiments, the first curved surface 505 and the second curved surface 506 are viewed from the cross-sectional view of the semiconductor substrate 400.

According to some embodiments, the first bump pad 406 and the second bump pad 407 further include a first seed layer 501 and a second seed layer 502 respectively. The first seed layer 501 and the second seed layer 502 surround the first curved surface 505 and the second curved surface 506 respectively. Therefore, the first seed layer 501 and the second seed layer 502 also have curved surfaces surrounded and contacted by the second dielectric layer 410. The first seed layer 501 and the second seed layer 502 can be used in forming or electroplating the first bump pad 406 and the second bump pad 407. The first seed layer 501, the second seed layer 502, the first bump pad 406, and the second bump pad 407 can include a same material (e.g. copper).

According to some embodiments, the first patterned conductive layer 401 and the fourth patterned conductive layer 404 may further include a third seed layer 503 and a fourth seed layer 504 respectively. The third seed layer 503 and the second seed layer 503 surround a first side surface 507 (e.g. a lower lateral surface, as shown in FIG. 5, which may be extend in a straight vertical direction) and a second side surface 508 (e.g. a lower lateral surface, as shown in FIG. 5, which may be extend in a straight vertical direction) of the first patterned conductive layer 401 and the fourth patterned conductive layer 404 respectively. The third seed layer 503 and the fourth seed layer 504 can be used in forming or electroplating the first patterned conductive layer 401 and the fourth patterned conductive layer 404 respectively. The third seed layer 503, the fourth seed layer 504, the first patterned conductive layer 401, and the fourth patterned conductive layer 404 can include a same material (e.g. copper).

According to some embodiments, the thickness of the first seed layer 501 (or the second seed layer 502) is greater than the thickness of the third seed layer 503 (or the fourth seed layer 504).

It is noted that the third seed layer 503 and the fourth seed layer 504 are optional. Therefore, in some embodiments, there is no seed layer surrounding the first patterned conductive layer 401 and the fourth patterned conductive layer 404.

According to the present disclosure, the first patterned conductive layer 401 and the first bump pad 406 can be formed by a single electroplating process rather than two separated electroplating processes. Accordingly, the first patterned conductive layer 401 and the first bump pad 406 can be an integrated component. Meanwhile, the fourth patterned conductive layer 404 and the second bump pad 407 can be formed by a single electroplating process such that the fourth patterned conductive layer 404 and the second bump pad 407 can also be an integrated component.

According to some embodiments, the first patterned conductive layer 401, the second patterned conductive layer 402, the third patterned conductive layer 403, and the fourth patterned conductive layer 404 have a substantially same width W1. The first bump pad 406 and the second bump pad 407 have a width W2 at the exposed surface 415. The first bump pad 406 and the second bump pad 407 have another width (e.g. a maximum width) W3 at a middle portion, or a portion surrounded by the second dielectric layer 410. In some embodiments the first bump pad 406 and the second bump pad 407 have convex curved surfaces 505 and 506 inside the second dielectric layer 410, and the width W3 is greater than the width W2. Moreover, as the first patterned conductive layer 401 and the first bump pad 406 (or the fourth patterned conductive layer 404 and the second bump pad 407) form a T-shaped pad, the widths W3 and W2 are greater than the width W1. For example, the width W1 is about 7 um, and the width W3 is about 25 um. Moreover, a distance W4 between the second conductive layer 402 and the third patterned conductive layer 403 is about 7 um. A distance W5 between the third conductive layer 403 and the fourth patterned conductive layer 404 (or the distance between the first conductive layer 401 and the second patterned conductive layer 402) is about 16 um. A bump pitch W6 between the first bump pad 406 and the second bump pad 407 is about equal to or smaller than about 60 um.

Moreover, when the width W3 of the bump pad (e.g. 406) is greater than the width W1 of the corresponding patterned conductive layer (e.g. 401), and the bump pad (e.g. 406) and the corresponding patterned conductive layer (e.g. 401) are configured as an integrated component, the connection between the bump pad (e.g. 406), and the corresponding patterned conductive layer (e.g. 401) may be unlikely to crack.

According to the embodiments shown in FIG. 4 and FIG. 5, the second patterned conductive layer 402 and the third patterned conductive layer 403 are covered by the second dielectric layer 410. The second dielectric layer 410 isolates the second patterned conductive layer 402 and the third patterned conductive layer 403 from the first bump pad 406 and the second bump pad 407. Therefore, copper pillars with solder material of a die may not undesirably contact the second patterned conductive layer 402 and the third patterned conductive layer 403 when the copper pillars are bonded to the first bump pad 406 and the second bump pad 407 respectively. Accordingly, the risk of an undesirable solder bridge may be reduced.

Moreover, the first bump pad 406 and the second bump pad 407 are embedded in the second dielectric layer 410, and the first bump pad 406 and the second bump pad 407 are not protruded from the exposed surface 415 of the second dielectric layer 410 (e.g. are substantially coplanar, or are recessed). Therefore, the copper pillars with solder material of a die may be bonded to the first bump pad 406 and the second bump pad 407 by using the standard flip chip bonding process, which can be readily accomplished. In other words, there is no need to modify the flip chip bonding process when the presented package substrate is bonded to a die.

In addition, as the first patterned conductive layer 401, the second patterned conductive layer 402, the first bump pad 406, and the second bump pad 407 are formed by a single electroplating process, a problem of registration shift may also be solved. Accordingly, the presented package substrate has good reliability in comparison to the related art.

Figure 6:
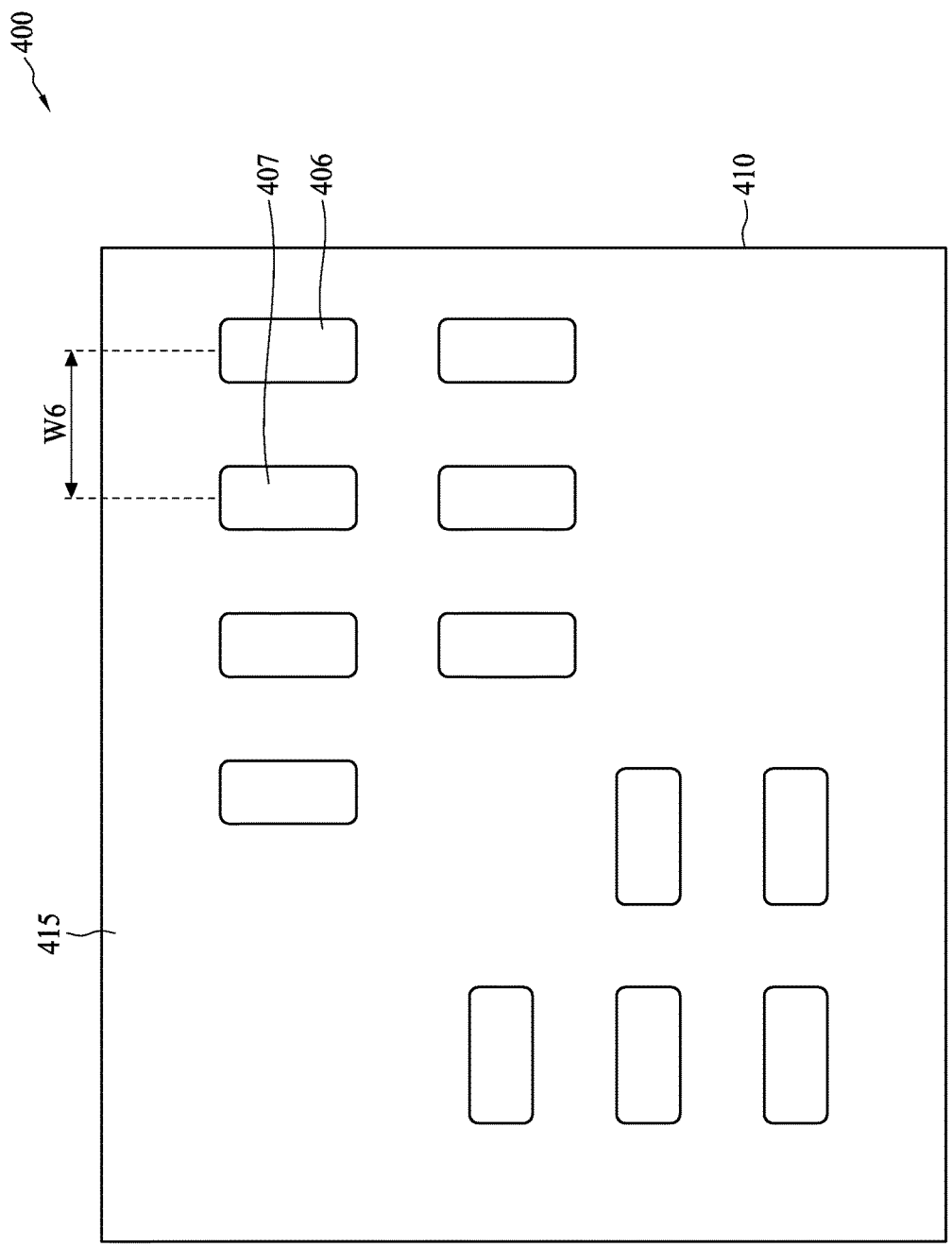
FIG. 6 is a diagram illustrating a top view of the semiconductor substrate shown in FIG. 4 in accordance with some embodiments.

FIG. 6 is a diagram illustrating a top view of the semiconductor substrate 400 in accordance with some embodiments. When the semiconductor substrate 400 is viewed from the top, a plurality of bump pads (e.g. the bump pads 406 and 407) are exposed from the top surface 415 of the second dielectric layer 410. The plurality of patterned conductive layers (e.g. the patterned conductive layers 402 and 403) are buried under the second dielectric layer 410. Accordingly, the risk of solder bridge may be reduced. Moreover, the bump pitch W6 between two bump pads may be designed to have a standard bump pitch (e.g. of about 60 um). Therefore, there is no need to modify the flip chip bonding process when the presented package substrate is bonded to a die.

Figure 7:
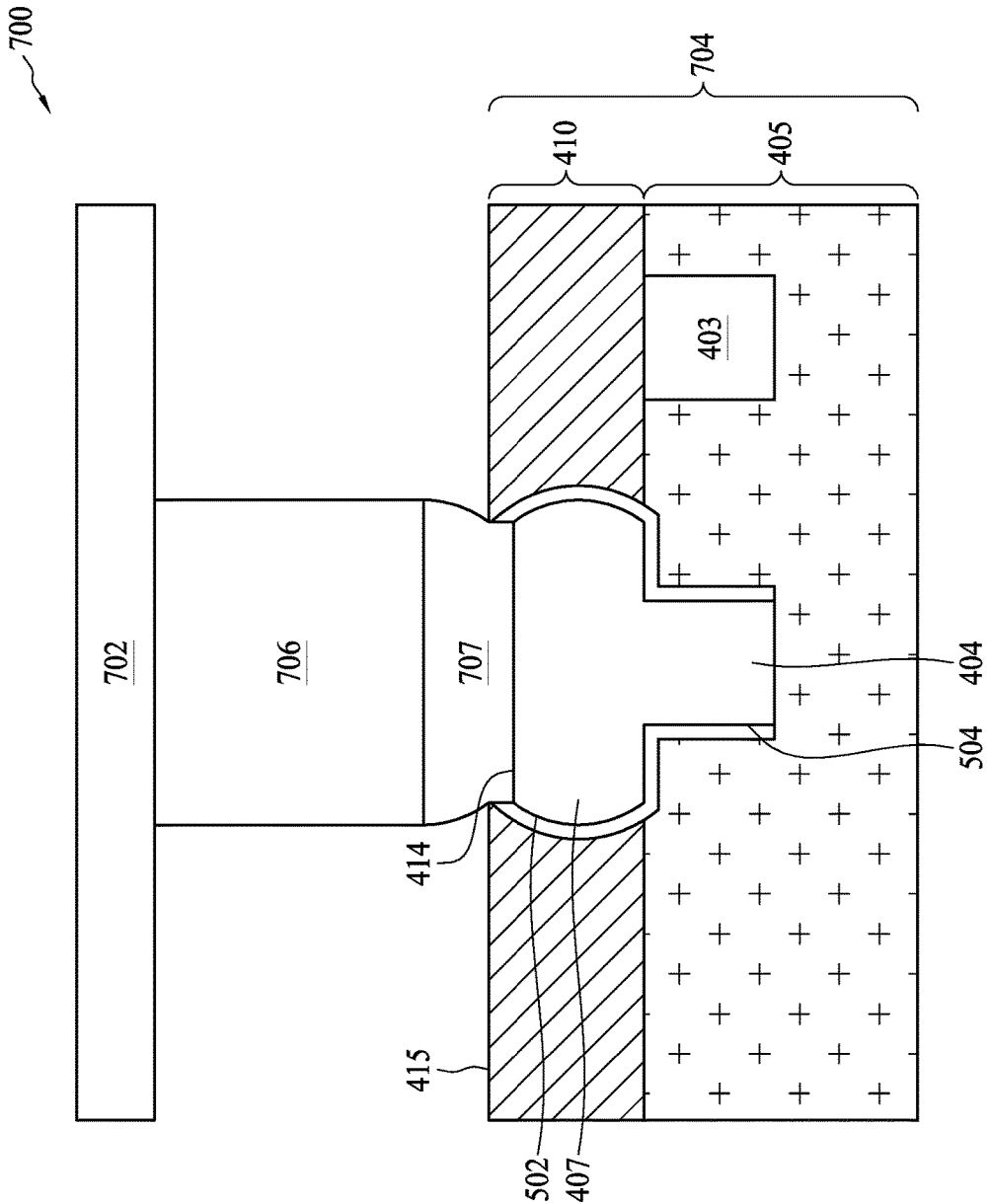
FIG. 7 is a cross-sectional diagram illustrating a semiconductor packaging device in accordance with some embodiments.

FIG. 7 is a cross-sectional diagram illustrating a semiconductor packaging device 700 in accordance with some embodiments. For brevity, only a portion of semiconductor packaging device 700 is shown in FIG. 7. The semiconductor packaging device 700 includes a die 702 and a portion of the semiconductor substrate 400. The die 702 includes a conductive pillar 706. The semiconductor substrate 400 includes the first dielectric layer 405, the second dielectric layer 410, the third patterned conductive layer 403, the fourth patterned conductive layer 404, and the second bump pad 407. The second bump pad 407 has a curved surface surrounded by the second dielectric layer 410. The conductive pillar 706 is electrically connected to the second bump pad 407 via a solder material 707. The solder material 707 is disposed on the exposed surface 414 of the second bump pad 407. In the depicted embodiments, the exposed surface 414 of the second bump pad 407 is lower than (recessed from) the exposed surface 415 of the second dielectric layer 410 such that the solder material 707 is constrained on the second bump pad 407. In addition, according to the depicted embodiments, the width of the second bump pad 407 is substantially the same as the width of the conductive pillar 706. For example, the width of the second bump pad 407 may be in a range of about 0.9 to about 1.1 times the width of the conductive pillar 706. Accordingly, the solder of the solder material 707 maintain structural integrity (e.g. may not collapse) when the solder material 707 is bonded to the second bump pad 407.

It is noted that the die 702 can further include another conductive pillar electrically connected to the first bump pad 406 of the semiconductor substrate 400 via a solder bump. The structure is similar to the structure shown in FIG. 7, and thus the detailed description is omitted here for brevity.

Figure 8:
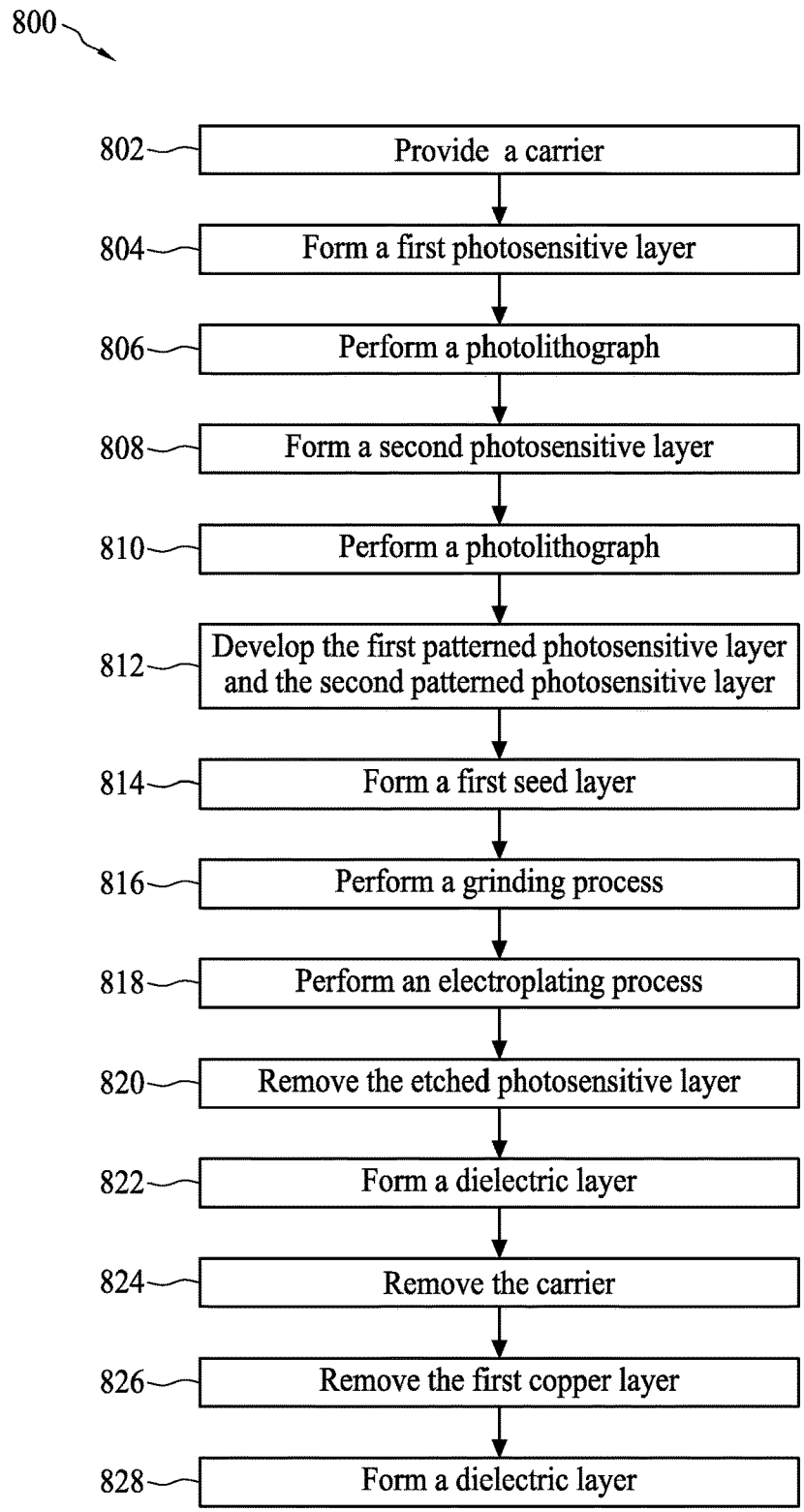
FIG. 8 is a flowchart illustrating some embodiments of a method of forming a semiconductor substrate in accordance with some embodiments.

FIG. 8 is a flowchart illustrating a method 800 of forming a semiconductor substrate in accordance with some embodiments. FIGS. 9-22 are cross-sectional diagrams illustrating the semiconductor structures corresponding to the operations 802-828 shown in FIG. 8.

Figure 9:
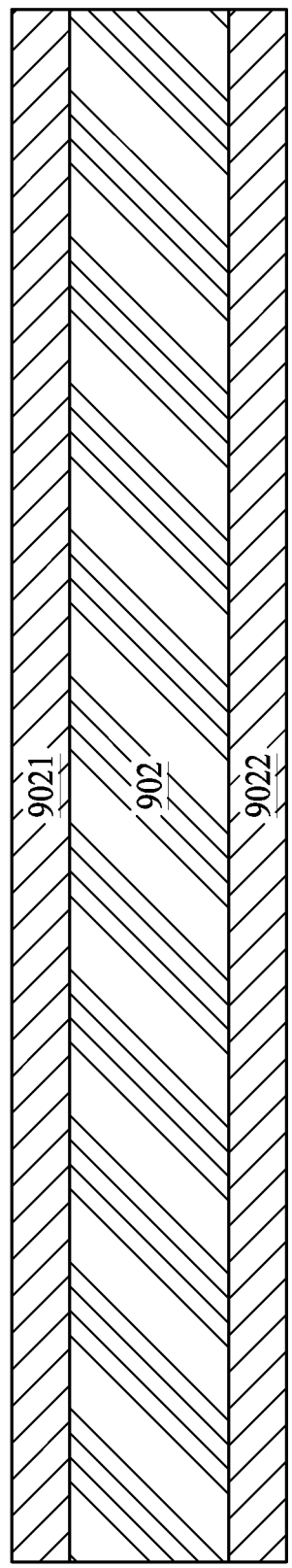
FIG. 9, FIG. 10, FIG. 11, FIG. 12, FIG. 13, FIG. 14, FIG. 15, FIG. 16, FIG. 17, FIG. 18, FIG. 19, FIG. 20, FIG. 21, and FIG. 22 are cross-sectional diagrams illustrating some embodiments of semiconductor structures corresponding to the operations 802-828 of the method shown in FIG. 8 respectively.

In operation 802 and as shown in FIG. 9, a carrier 902 is provided. A first copper layer 9021 is formed on the top surface of the carrier 902, and a second copper layer 9022 is formed on the top surface of the carrier 902.

Figure 10:
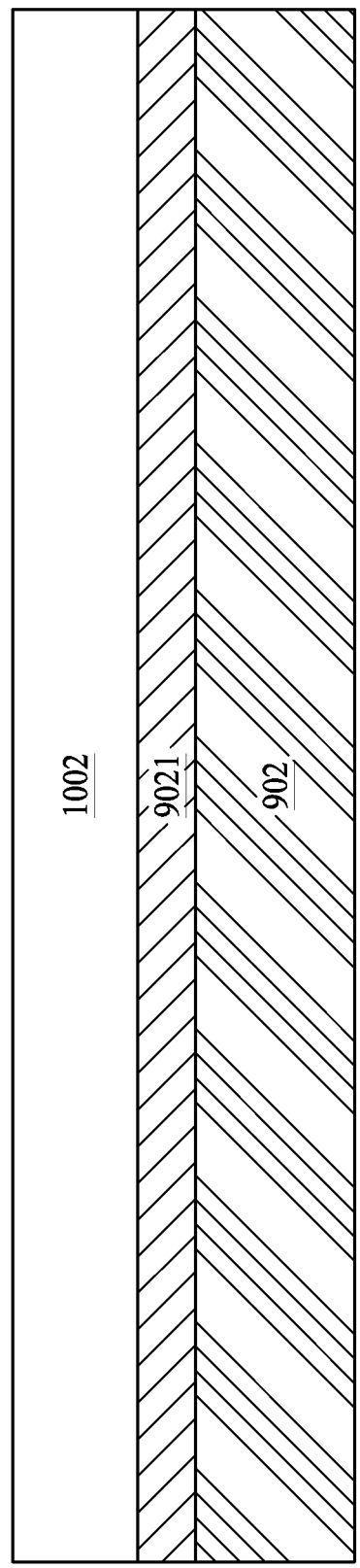

In operation 804 and as shown in FIG. 10, a first photosensitive layer 1002 is formed on a surface of the first copper layer 9021. The first photosensitive layer 1002 may be a dielectric layer. In the depicted embodiments, the second copper layer 9022 is removed in the operation 804. However, in other embodiments the second copper layer 9022 need not be removed.

Figure 11:
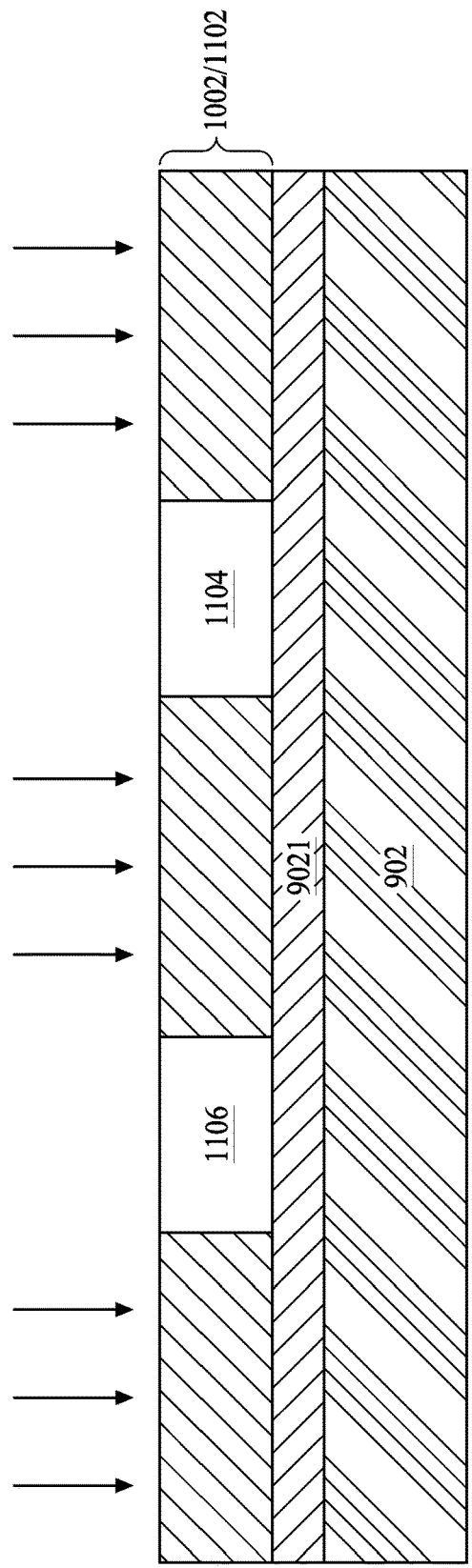

In operation 806 and as shown in FIG. 11, a photolithography is performed upon the first photosensitive layer 1002 for patterning the first photosensitive layer 1002 to be a first patterned photosensitive layer 1102. In the photolithography, the first photosensitive layer 1002 may be exposed to a specific light, such as ultraviolet (UV) light. In the depicted embodiments, the portion not exposed to UV light is to be etched in the following operations. However, in other embodiments, the portion exposed to the UV light is to be etched in the following operations. Accordingly, in the depicted embodiments, the first patterned photosensitive layer 1102 is formed in the operation 806. The first patterned photosensitive layer 1102 includes a first non-exposed portion 1104 and a second non-exposed portion 1106.

Figure 12:
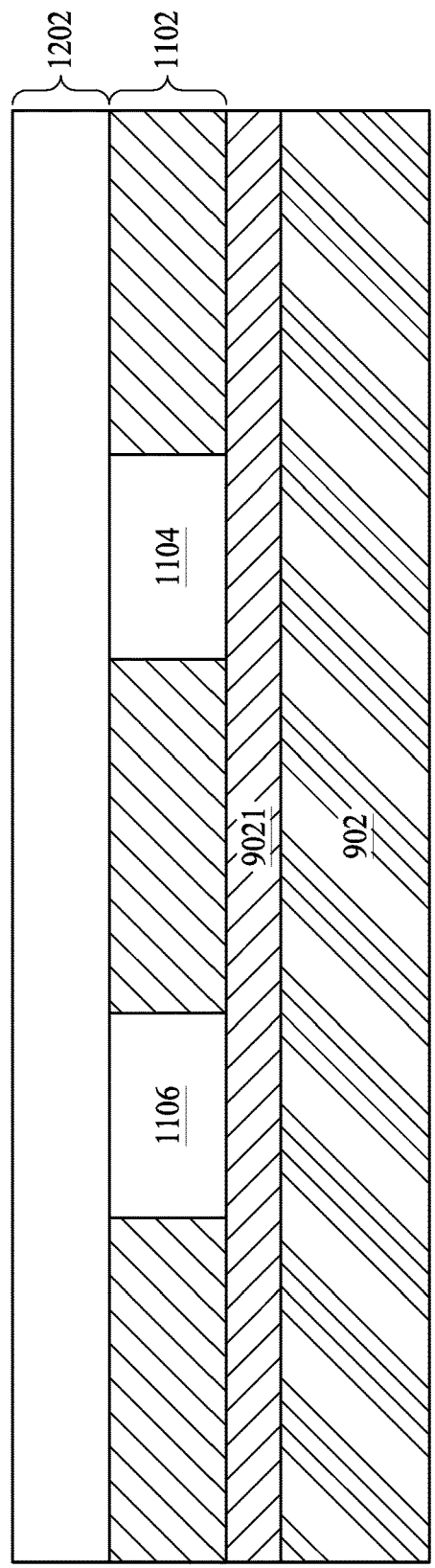

In operation 808 and as shown in FIG. 12, a second photosensitive layer 1202 is formed on the first patterned photosensitive layer 1102. The second photosensitive layer 1202 may be a dry-film.

Figure 13:
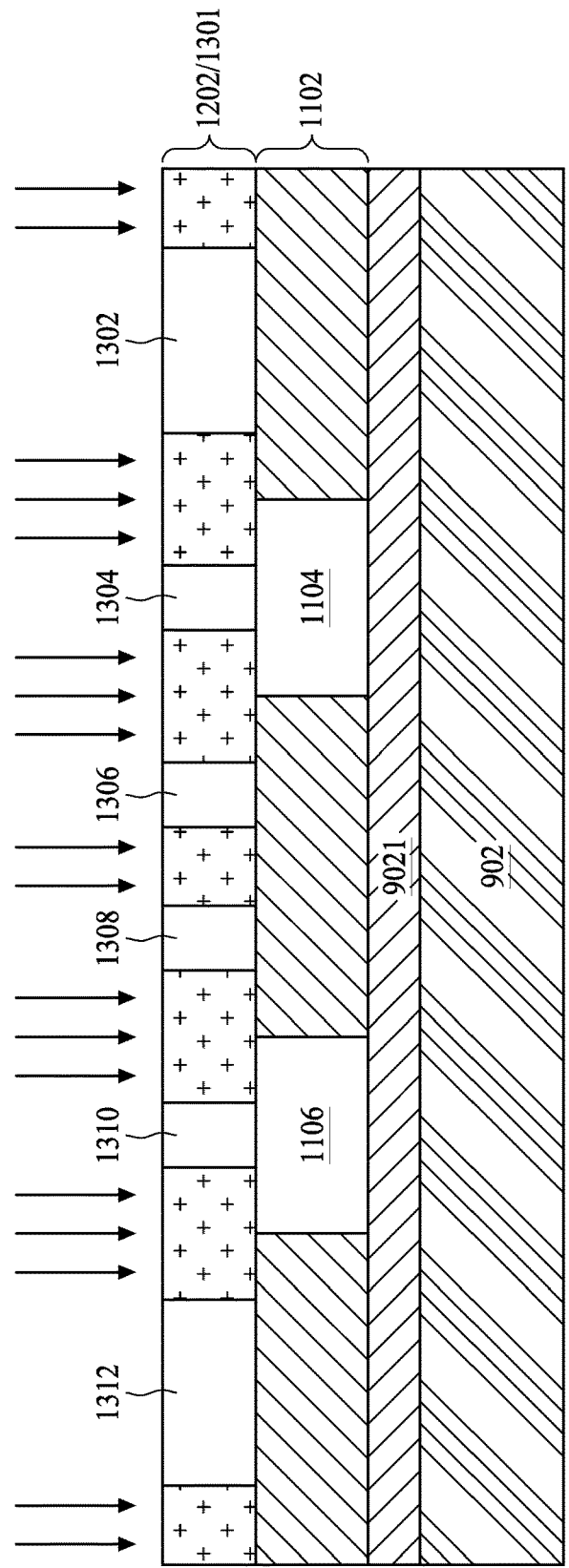

In operation 810 and as shown in FIG. 13, a photolithography is performed upon the second photosensitive layer 1202 for patterning the second photosensitive layer 1202 to be a second patterned photosensitive layer 1301. In the photolithography, the second photosensitive layer 1202 may be exposed to a specific light, such as UV light. In the depicted embodiments, the portion not exposed to UV light is to be etched in the following operations. However, i other embodiments, the portion exposed to the UV light is to be etched in the following operations. Accordingly, in the depicted embodiments, the second patterned photosensitive layer 1301 is formed in the operation 810. The second patterned photosensitive layer 1301 includes a plurality of non-exposed portions 1302, 1304, 1306, 1308, 1310, and 1312. According to the depicted embodiments, the non-exposed portions 1304 and 1310 are located on the non-exposed portions 1104 and 1106 respectively. More specifically, the non-exposed portions 1304 and 1310 are substantially aligned with the non-exposed portions 1104 and 1106 respectively. It is noted that the non-exposed portions 1304 and 1310 need not be aligned to the centers of the non-exposed portions 1104 and 1106 respectively. For example, the non-exposed portion 1304 may be slightly shifted to the left side of the center of the non-exposed portions 1104, or the non-exposed portions 1310 may be slightly shifted to the right side of the center of the non-exposed portions 1106.

Figure 14:
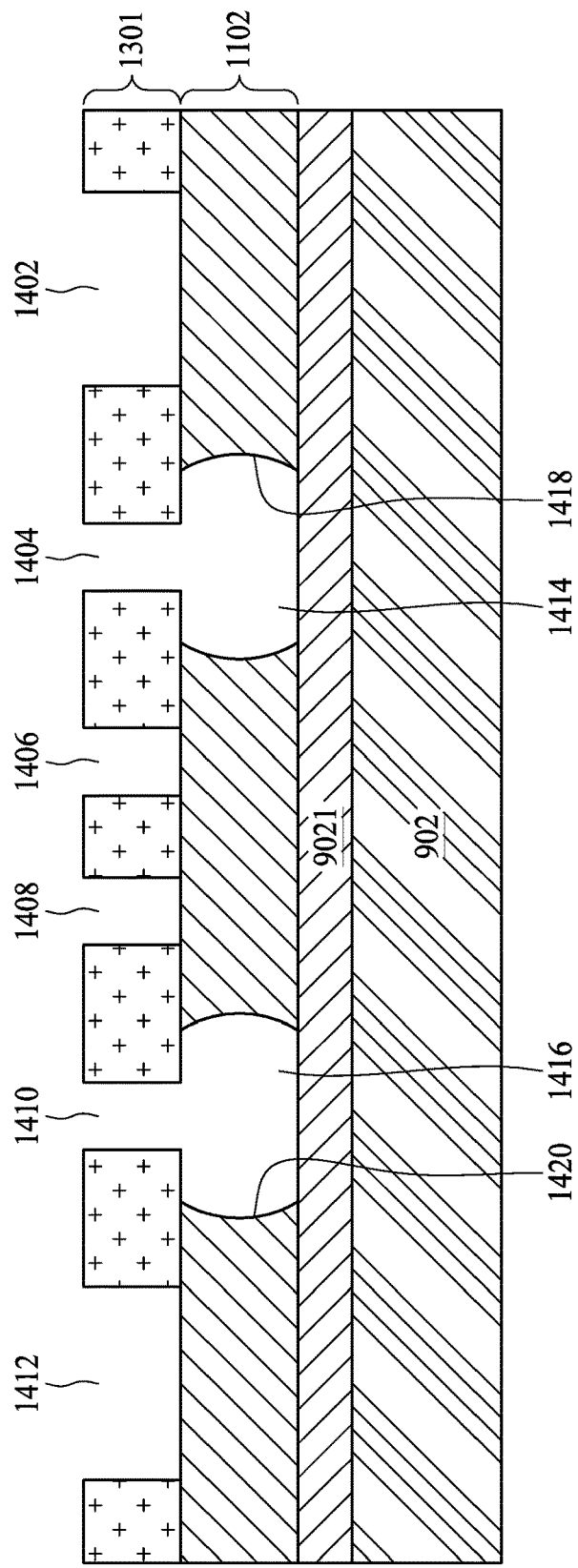

In operation 812 and as shown in FIG. 14, the first patterned photosensitive layer 1102 and the second patterned photosensitive layer 1301 are developed for etching the non-exposed portions 1104, 1106, 1302, 1304, 1306, 1308, 1310, and 1312. According to the depicted embodiments, the non-exposed portions 1104, 1106, 1302, 1304, 1306, 1308, 1310, and 1312 are etched by a single etching process rather than two separated etching processes. In the operation 812, a plurality of holes 1402, 1404, 1406, 1408, 1410, 1412, 1414, 1416, and 1418 are formed, the holes being defined by the second patterned photosensitive layer 1301. The holes 1404 and 1410 are aligned to the holes 1414 and 1416 respectively. The widths of the holes 1414 and 1416 are greater than the widths of the holes 1404 and 1410 respectively. Moreover, the holes 1414 and 1416 have curved inner surfaces 1418 and 1420 respectively. In addition, the holes 1404 and 1410 can be substantially aligned to the holes 1414 and 1416, respectively, because the first patterned photosensitive layer 1102 and the second patterned photosensitive layer 1301 are developed by a single etching process.

Figure 15:
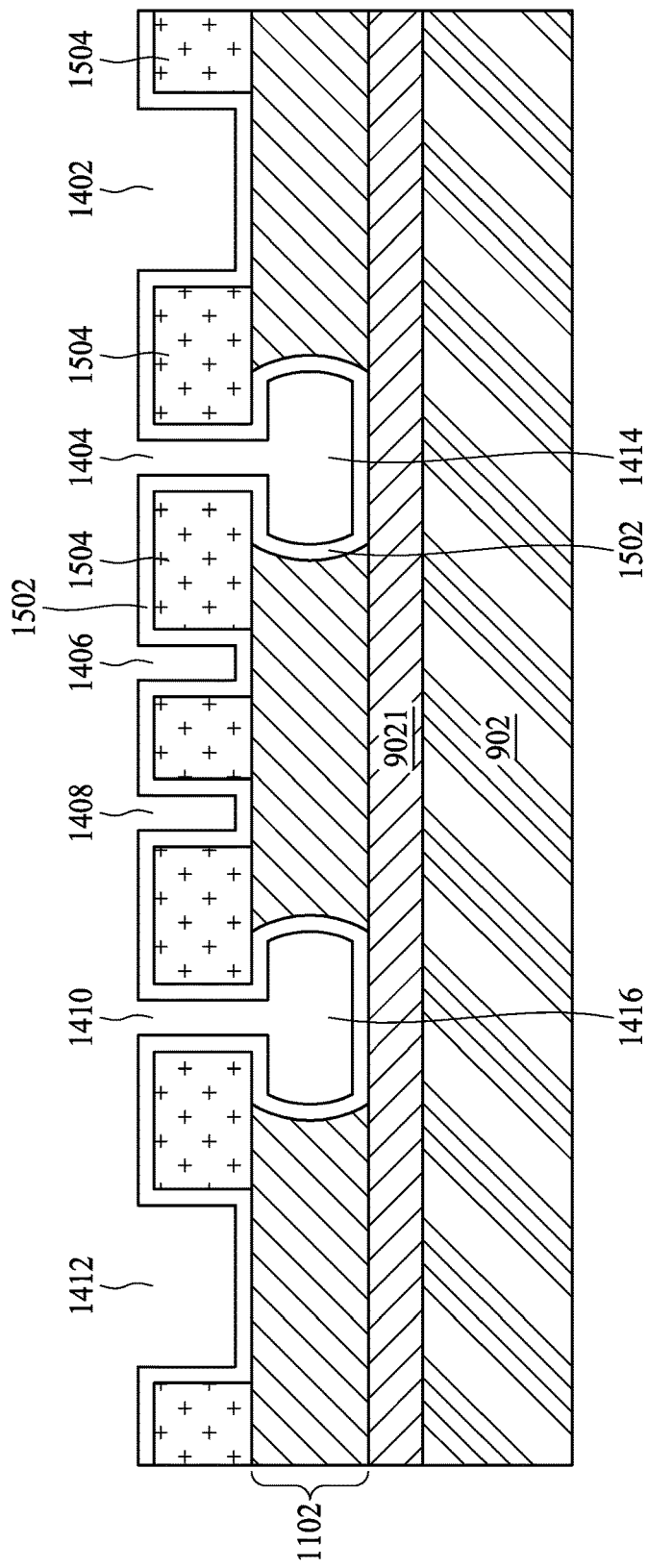

In operation 814 and as shown in FIG. 15, a first seed layer 1502 is formed on inner surfaces of the holes 1402, 1404, 1406, 1408, 1410, 1412, 1414, and 1416, and on the surface of the etched photosensitive layer 1504. The first seed layer 1502 may include copper.

Figure 16:
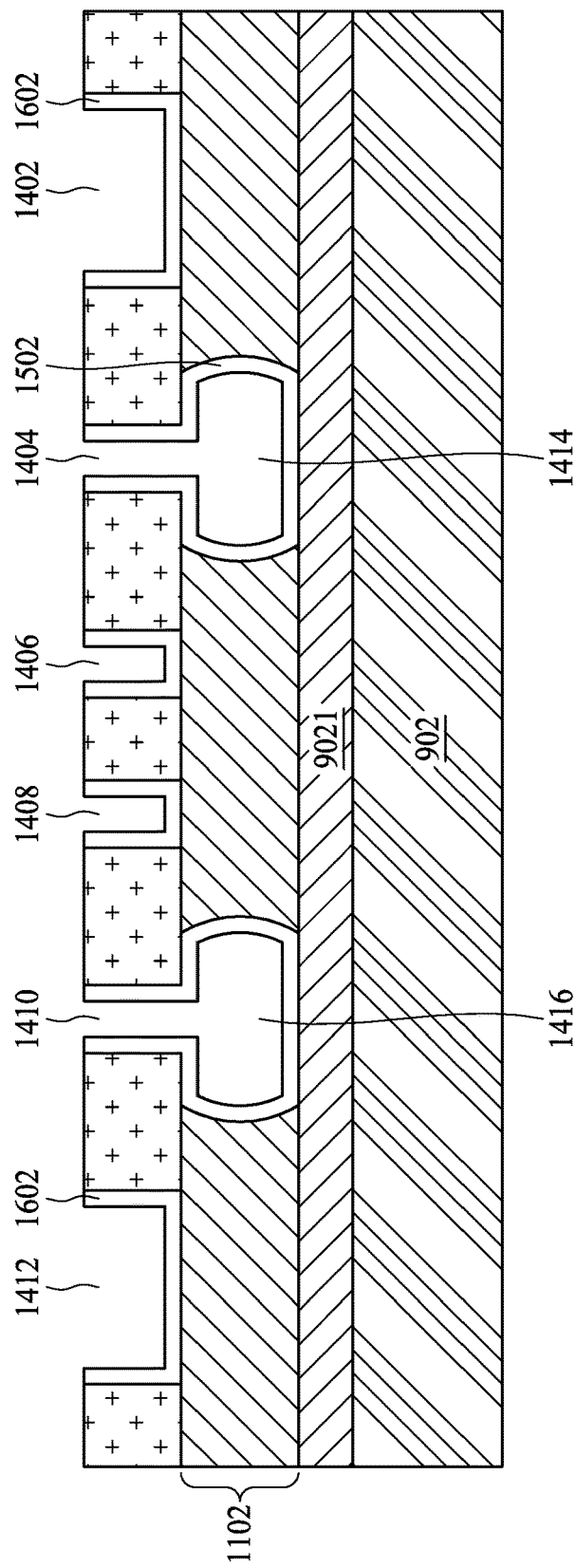

In operation 816 and as shown in FIG. 16, a grinding process is performed to remove the first seed layer 1502 on a top surface of the etched photosensitive layer 1504. Moreover, in the operation 816, the first seed layer 1502 on the inner surfaces of the holes 1402, 1404, 1406, 1408, 1410, 1412 are roughed to form a rough seed layer 1602 on the inner surfaces of the holes 1402, 1404, 1406, 1408, 1410, 1412. Accordingly, the thickness of the rough seed layer 1602 on the inner surfaces of the holes 1402, 1404, 1406, 1408, 1410, 1412 is smaller than the thickness of the first seed layer 1502 on the inner surfaces of the holes 1414 and 1416. It is noted that the first seed layer 1602 on the inner surfaces of the holes 1402, 1404, 1406, 1408, 1410, 1412 may be eliminated during the roughening process. In other words, there may be no seed layer left on the inner surfaces of the holes 1402, 1404, 1406, 1408, 1410, 1412 after the roughening process.

Figure 17:
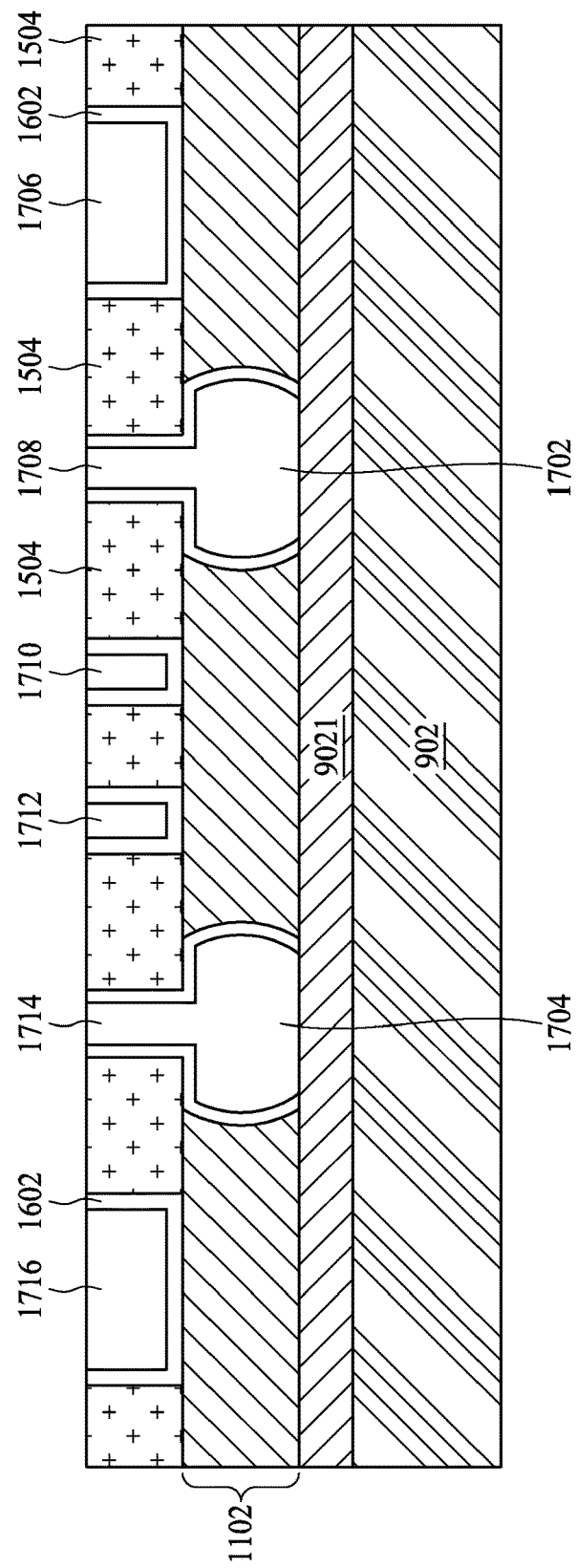

In operation 818 and as shown in FIG. 17, an electroplating process is performed to electroplate copper on the first seed layer 1502 and on the rough seed layer 1602 to form a first bump pad 1702, a second bump pad 1704, and a plurality of conductive layers 1706, 1708, 1710, 1712, 1714, and 1716. Accordingly, the first bump pad 1702 and the conductive layer 1708 are configured as an integrated component, and the second bump pad 1704 and the conductive layer 1714 are also configured as an integrated component.

Figure 18:
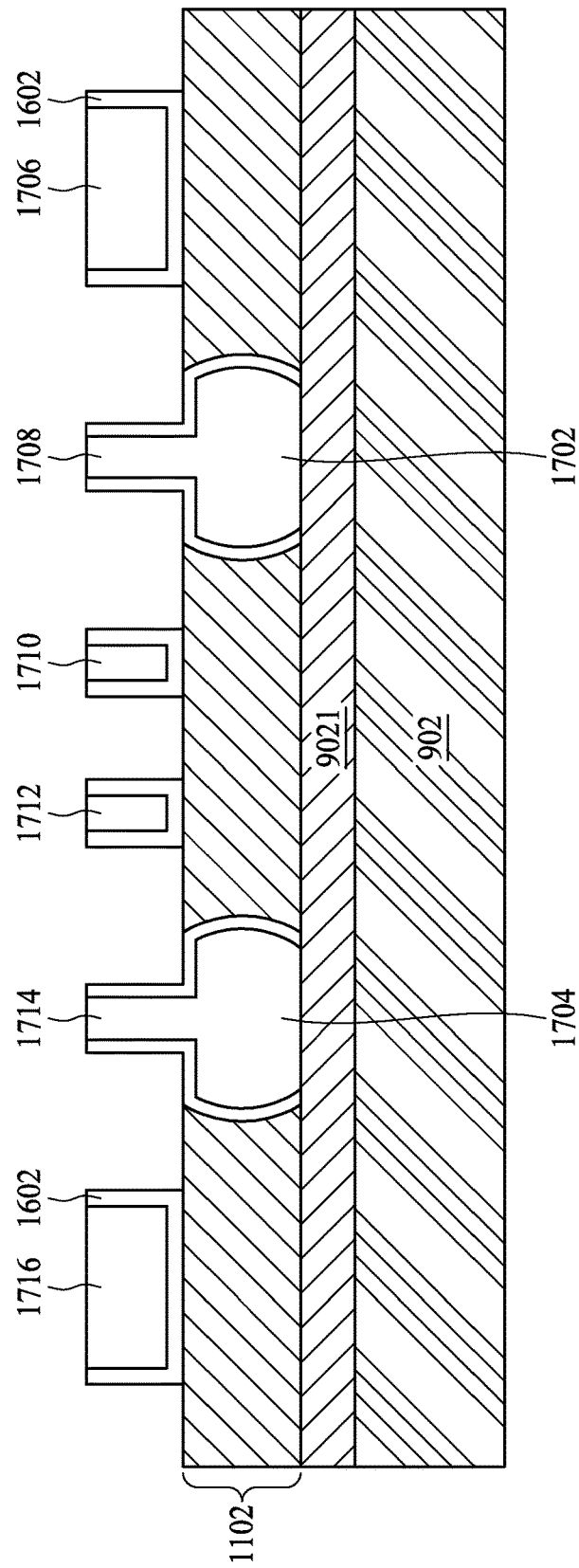

In operation 820 and as shown in FIG. 18, the etched photosensitive layer 1504 is removed to expose the first patterned photosensitive layer 1102.

Figure 19:
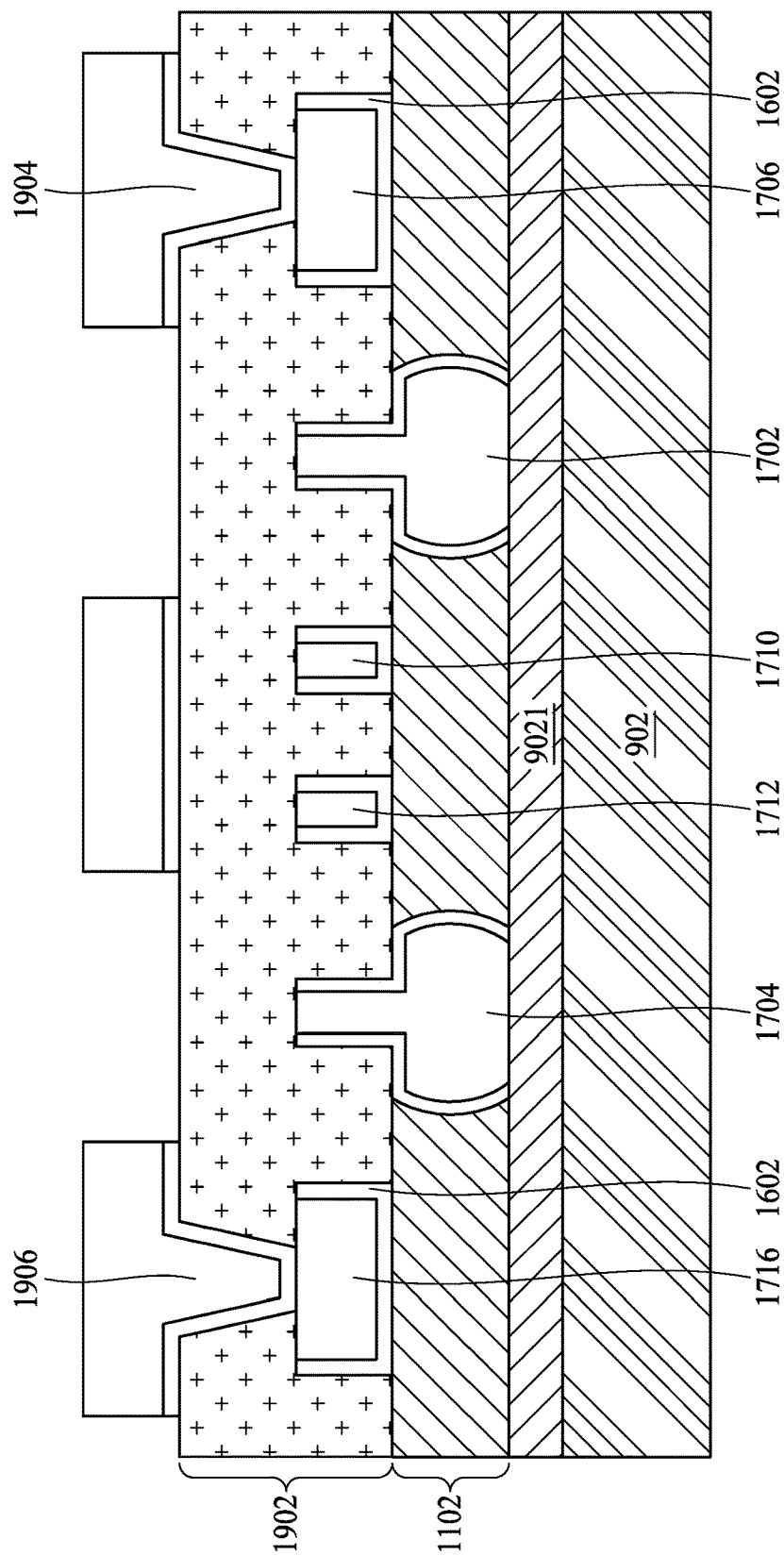

In operation 822 and as shown in FIG. 19, a dielectric layer 1902 is formed on the first patterned photosensitive layer 1102 to cover the conductive layers 1706, 1708, 1710, 1712, 1714, and 1716. The dielectric layer 1902 is then laser drilled, and a first conductive post 1904 and a second conductive post 1906 are formed on the conductive layers 1706 and 1716 respectively.

Figure 20:
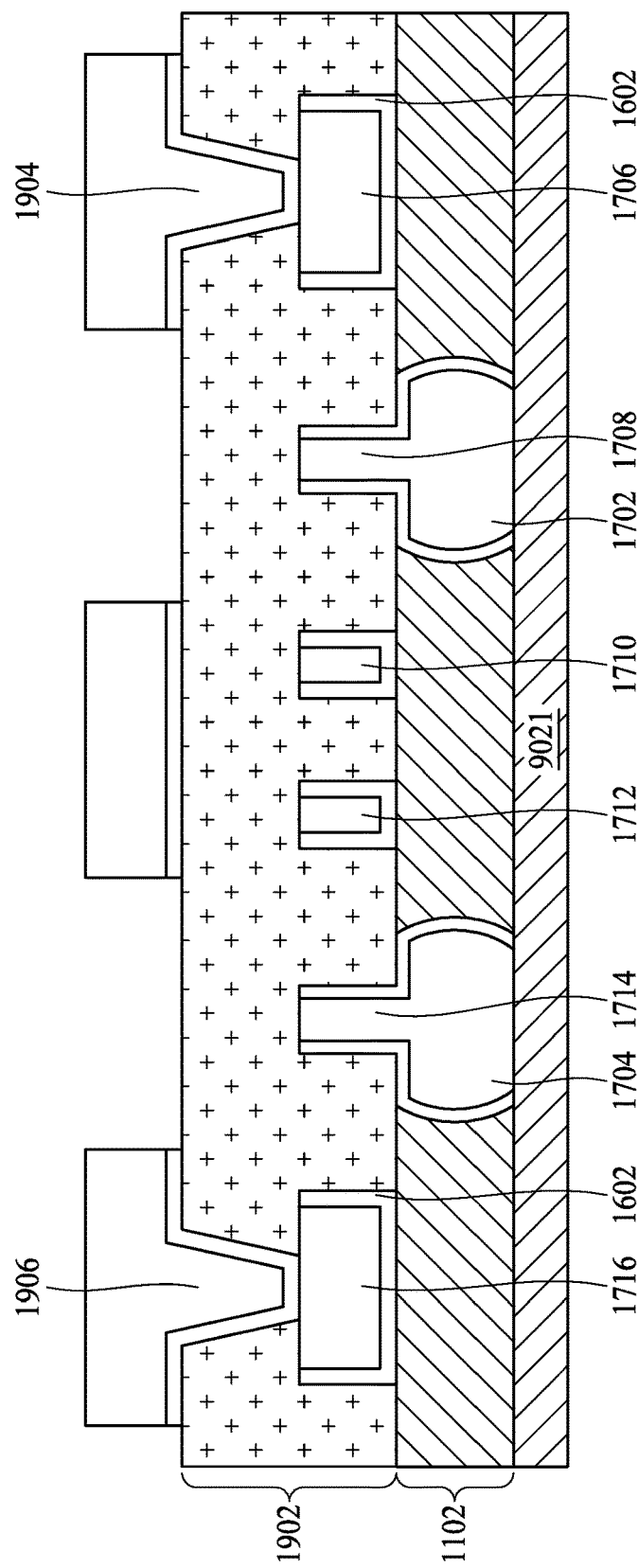

In operation 824 and as shown in FIG. 20, the carrier 902 is removed to expose the first copper layer 9021.

Figure 21:
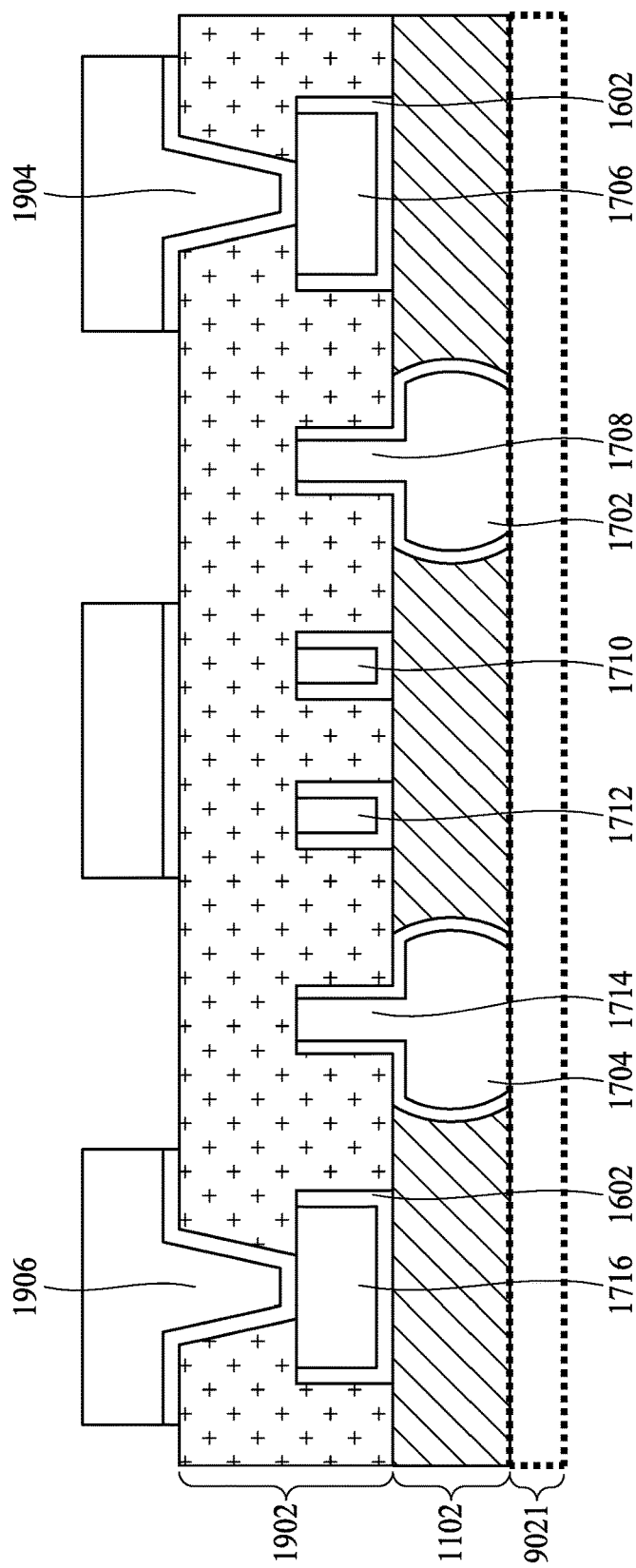

In operation 826 and as shown in FIG. 21, the first copper layer 9021 is removed to expose the first bump pad 1702, the second bump pad 1704, and the first patterned photosensitive layer 1102. Accordingly, the first bump pad 1702 and the second bump pad 1704 (and in some embodiments, only the first bump pad 1702 and the second bump pad 1704) are exposed from the surface of the first patterned photosensitive layer 1102. When the first copper layer 9021 is etched to expose the first bump pad 1702 and the second bump pad 1704, the conductive layers 1710 and 1712 are protected by the first patterned photosensitive layer 1102. In other words, the thicknesses of the conductive layers 1710 and 1712 are not substantially affected by the etching process in the operation 826. Moreover, the first bump pad 1702 and the second bump pad 1704 may be over-etched to make the surfaces of the first bump pad 1702 and the second bump pad 1704 lower than (recessed from) the surface of the first patterned photosensitive layer 1102 in a configuration similar to that shown in FIG. 7.

Figure 22:
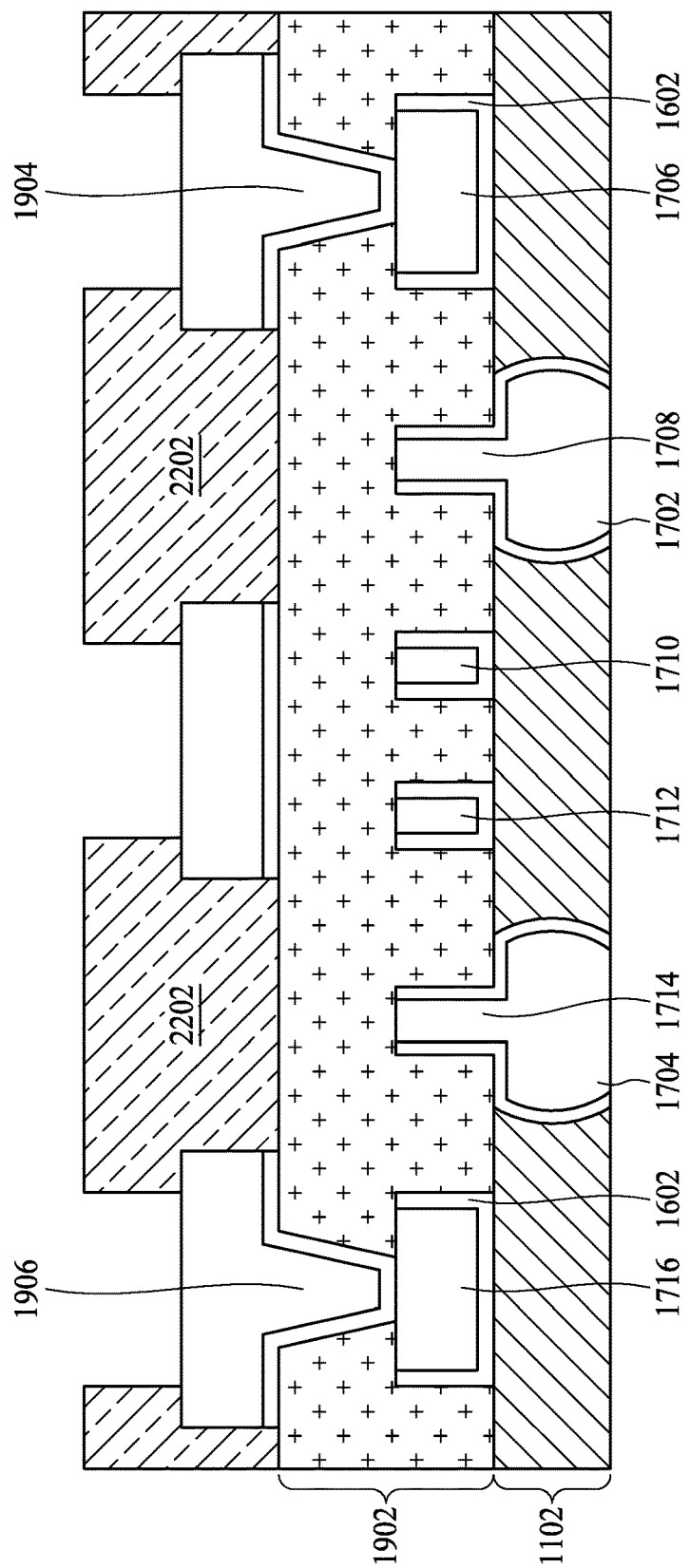

In operation 828 and as shown in FIG. 22, a dielectric layer 2202 is formed on the dielectric layer 1902. The first conductive post 1904 and the second conductive post 1906 are exposed from the dielectric layer 1902 in order to receive solder balls respectively. In operation 828, the presented semiconductor substrate is formed. A detailed configuration of the semiconductor substrate is described above in reference to FIG. 4 and FIG. 5. The detailed description is omitted here for brevity.

Figure 23:
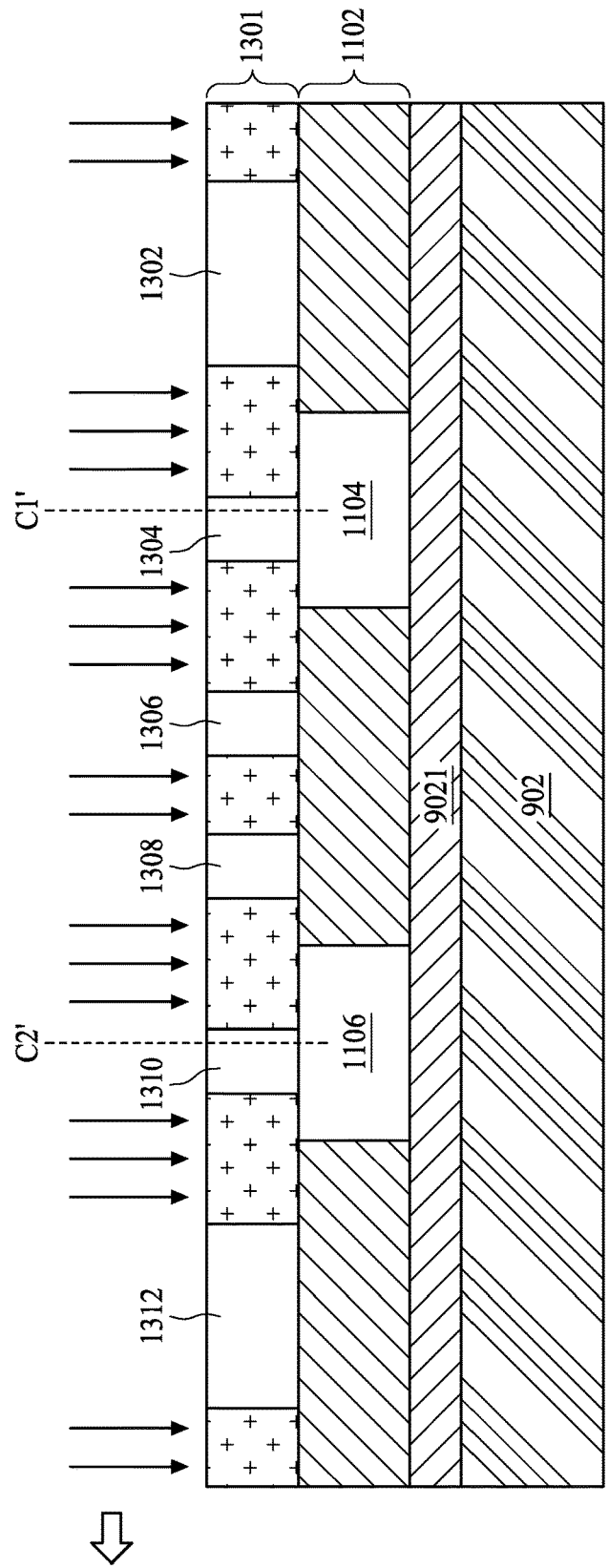
FIG. 23 is a cross-sectional diagram illustrating a first patterned photosensitive layer and a second patterned photosensitive layer after photolithography according to some embodiments of the present disclosure.
Figure 24:
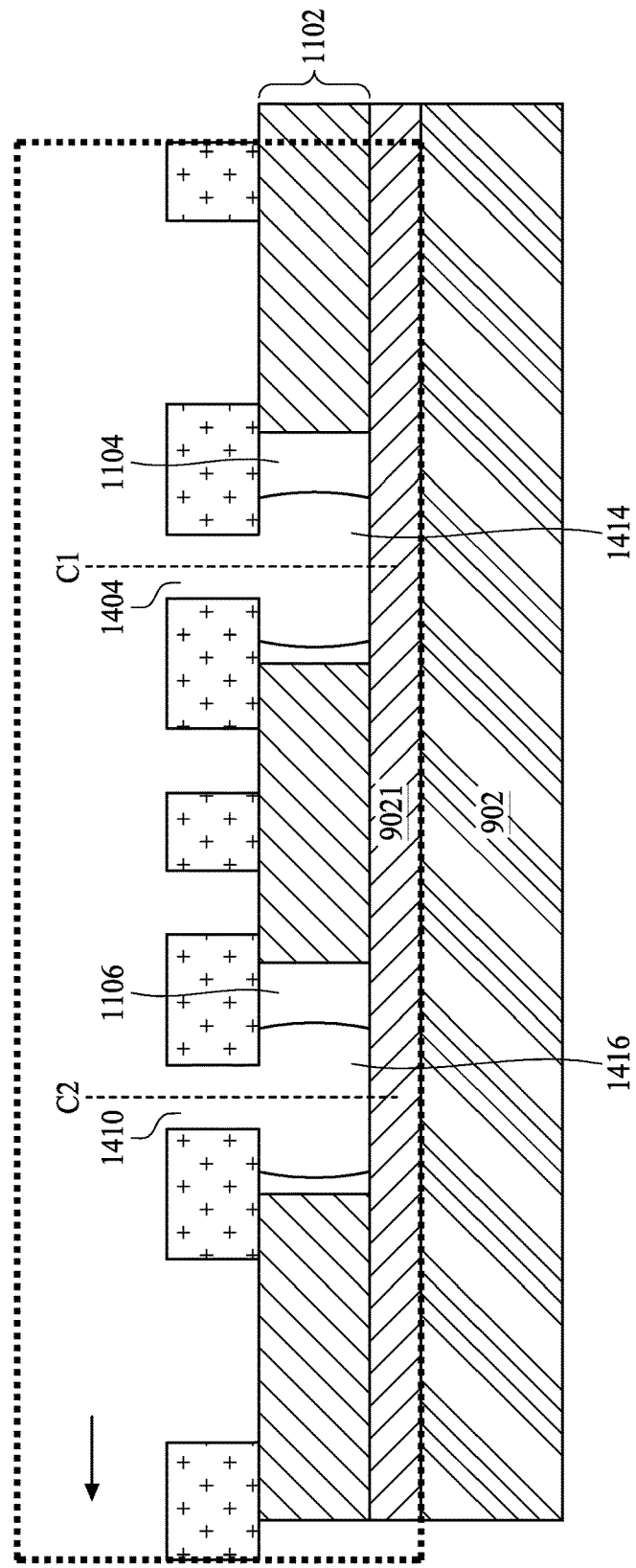
FIG. 24 is a cross-sectional diagram illustrating a first patterned photosensitive layer and a second patterned photosensitive layer after an etching process according to some embodiments of the present disclosure.

It is noted that, in the operation 810, the second patterned photosensitive layer 1301 may not be aligned to a preferred position on the first patterned photosensitive layer 1102 during the photolithography. FIG. 23 is a cross-sectional diagram illustrating the first patterned photosensitive layer 1102 and the second patterned photosensitive layer 1301 after the photolithography according to embodiments of the present disclosure. As shown in FIG. 23, the non-exposed portions 1302, 1304, 1306, 1308, 1310, and 1312 are slightly shifted to the left side on the first patterned photosensitive layer 1102 such that the non-exposed portions 1304 and 1310 are not aligned to the centers C1' and C2' of the non-exposed portions 1104 and 1106 respectively. However, during the etching process in operation 812, the non-exposed portions 1304, 1310, 1104, and 1106 are etched by the single etching process or the same etchant or the same developer. After the etching process in operation 812, the holes 1404 and 1410 are aligned to the centers C1 and C2 of the holes 1414 and 1416 as shown in FIG. 24. FIG. 24 is a cross-sectional diagram illustrating the first patterned photosensitive layer 1102 and the second patterned photosensitive layer 1301 after the etching process according to some embodiments of the present disclosure. In other words, when the non-exposed portions 1104 and 1106 are overlapped to the non-exposed portions 1304 and 1310 respectively, and when the widths of the non-exposed portions 1104 and 1106 are designed to be greater than the widths of the non-exposed portions 1304 and 1310 respectively, the non-exposed portions 1304 and 1310 may have some margins to shift from the centers of the non-exposed portions 1104 and 1106 respectively.

As shown in FIG. 24, when the non-exposed portions 1304 and 1310 of the second patterned photosensitive layer 1301 are originally not aligned to the centers of the non-exposed portions 1104 and 1106 of the first patterned photosensitive layer 1102 respectively, the amount of non-exposed portions 1304 and 1310 remaining on the sides of the holes 1414 and 1416 are not equal respectively. For example, the width on the left side of the non-exposed portion 1104 is smaller than the width on the right side of the non-exposed portion 1104.

Figure 25:
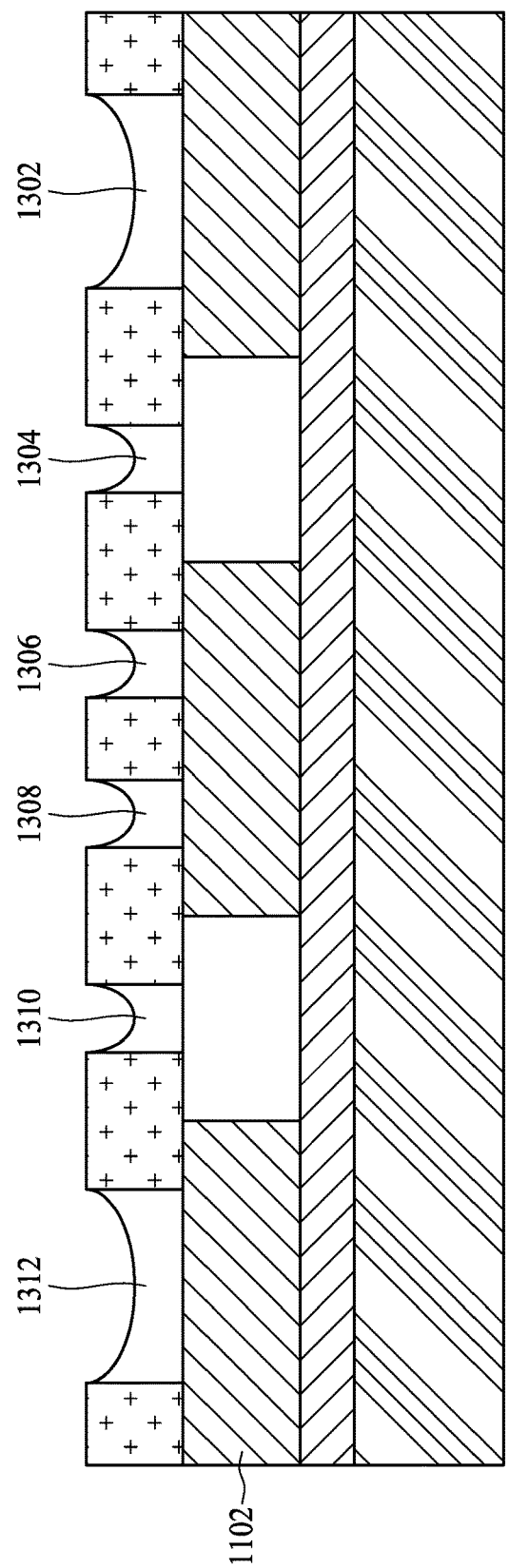
FIG. 25, FIG. 26, FIG. 27, and FIG. 28 are diagrams illustrating a variation of non-exposed portions during a development process in accordance with some embodiments.

In some embodiments, the operation 812 includes a development process illustrated in FIGS. 25-28. In FIG. 25, a developer is applied to the non-exposed portions 1302, 1304, 1306, 1308, 1310, and 1312. As shown in FIG. 25, portions of the non-exposed portions 1302, 1304, 1306, 1308, 1310, and 1312 are removed.

Figure 26:
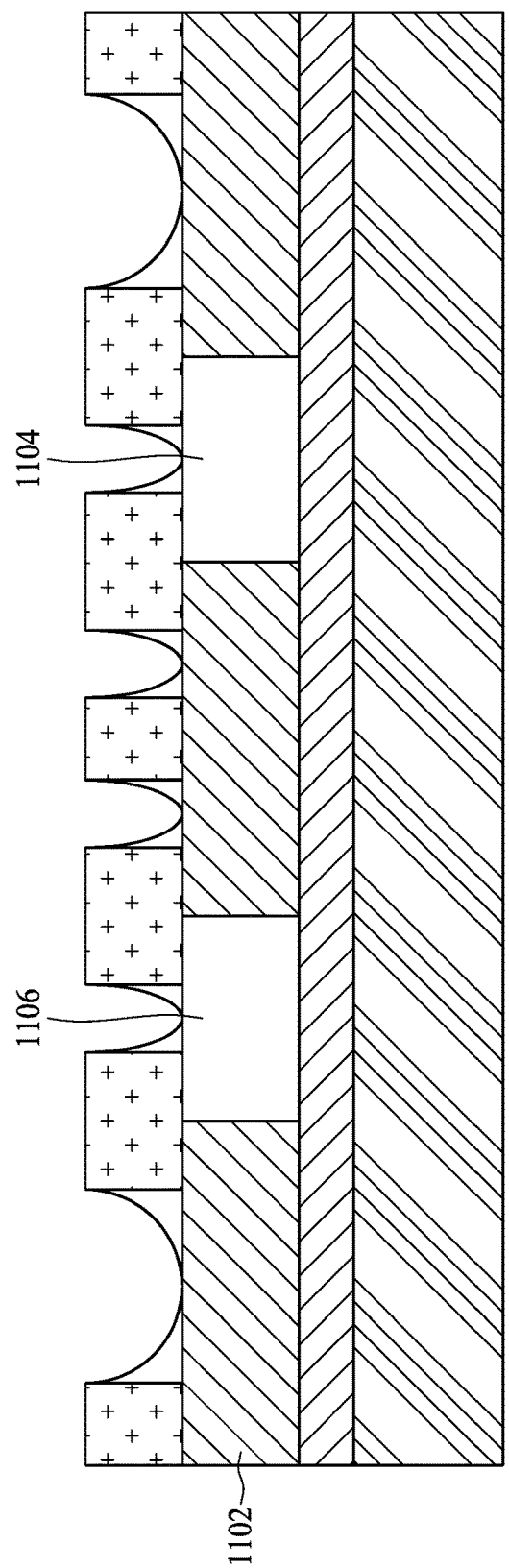

As shown in FIG. 26, almost all of (e.g. between a majority of and substantially all of) the non-exposed portions 1302, 1304, 1306, 1308, 1310, and 1312 are removed, and the first patterned photosensitive layer 1102 and the non-exposed portions 1104 and 1106 start are exposed to the developer.

Figure 27:
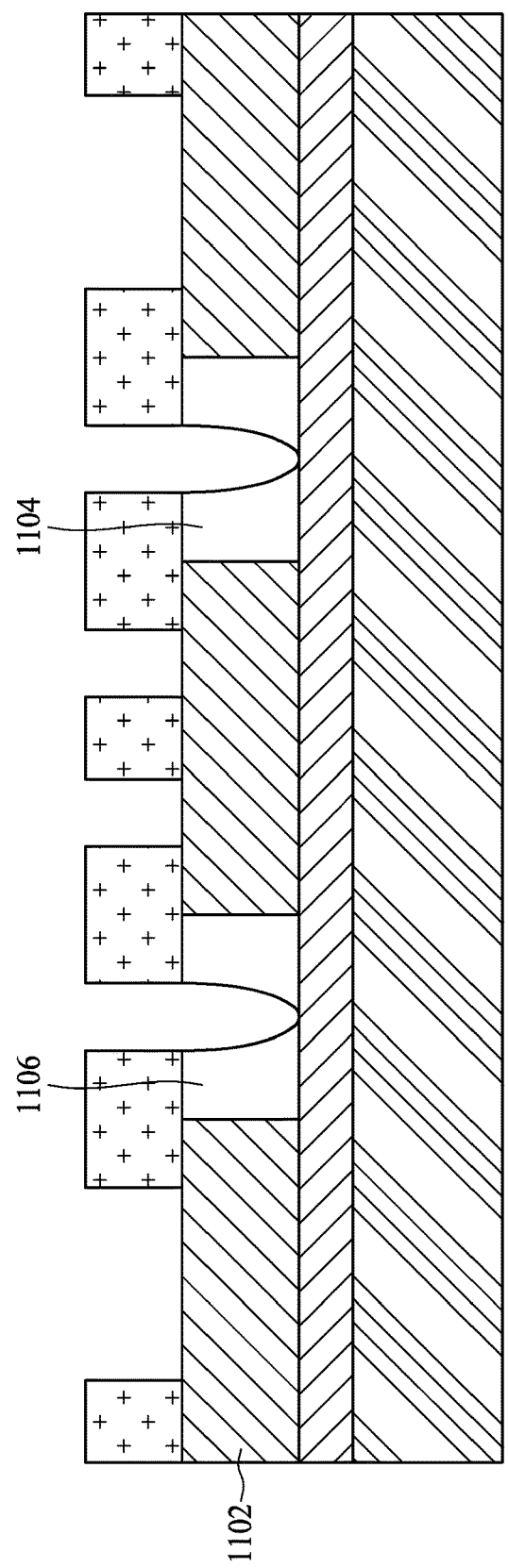

As shown in FIG. 27, substantially all of the non-exposed portions 1302, 1304, 1306, 1308, 1310, and 1312 are removed, and portions of the non-exposed portions 1104 and 1106 are removed. In FIG. 27, the developer etches the non-exposed portions 1104 and 1106 from the top portion to the bottom portion (e.g. forms a trench that traverses the non-exposed portions 1104 and 1106 from a top surface to a bottom surface).

Figure 28:
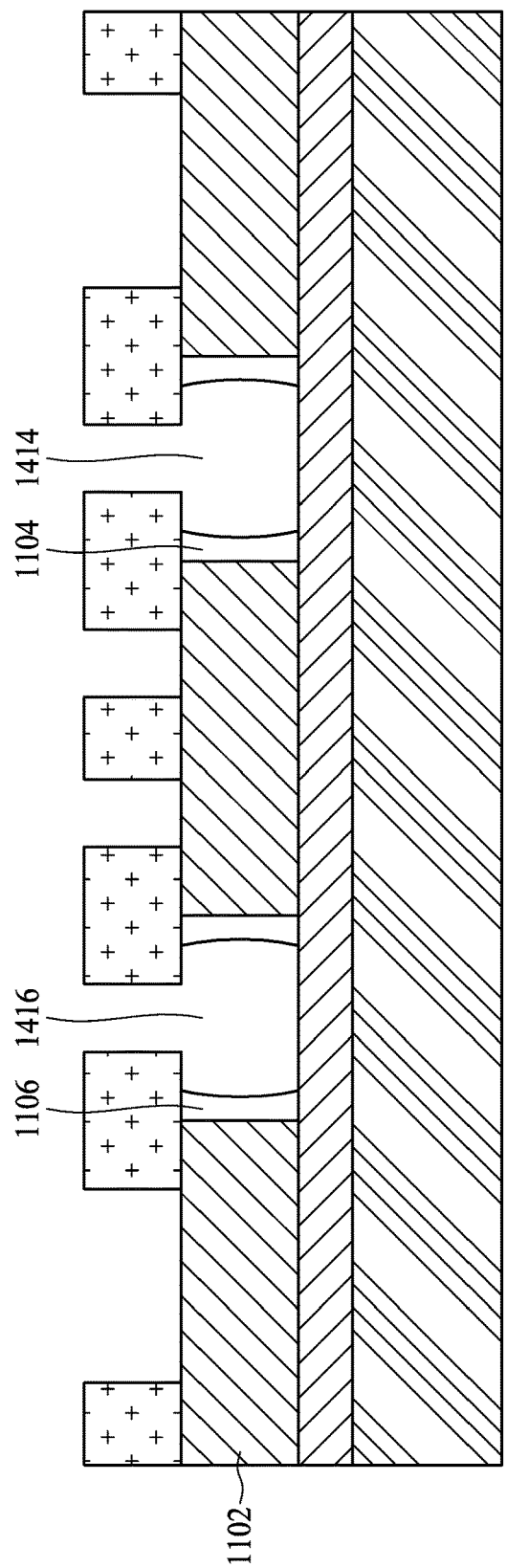

As shown in FIG. 28, when the bottom portions of the non-exposed portions 1104 and 1106 are etched and the first copper layer 9021 is exposed, the developer continues to etch the side portions of the non-exposed portions 1104 and 1106. When the developer is removed, the holes 1414 and 1416 having curved inner surfaces are formed. According to some embodiments, not all of the non-exposed portions 1104 and 1106 are etched by the developer. As shown in FIG. 28, some of the non-exposed portions 1104 and 1106 still remain in the first patterned photosensitive layer 1102. The widths of the holes 1414 and 1416 may be controlled by the reaction time of the developer. The widths of the holes 1414 and 1416 may also be controlled by the material of the first patterned photosensitive layer 1102, the material of the developer, and/or the process temperature.

Briefly, according to embodiments described herein, when the non-exposed portions of the first patterned photosensitive layer 1102 and the non-exposed portions of the second patterned photosensitive layer 1301 are developed by a single etching process, the holes 1404 and 1410 can be aligned to the holes 1414 and 1416 respectively. Therefore, the problem of registration shift is solved. Moreover, when the holes 1404 and 1410, and the holes 1414 and 1416 are electroplated by a single electroplating process, the first bump pad 1702 and the conductive layer 1708, and the second bump pad 1704 and the conductive layer 1714 can be integrated components respectively. This can help to prevent a connection between the bump pad and the corresponding patterned conductive layer from cracking.

The foregoing outlines features of several embodiments and details aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and that various changes, substitutions, and alterations may be made without departing from the spirit and scope of the present disclosure.

What is claimed is:

1. A semiconductor substrate, comprising:
a first dielectric layer;
a first patterned conductive layer disposed in the first dielectric layer;
a second dielectric layer disposed on the first dielectric layer;
a first bump pad disposed in the second dielectric layer, the first bump pad electrically connected to the first patterned conductive layer, and the first bump pad having a curved surface surrounded by the second dielectric layer, and the first bump pad having a top surface exposed from the second dielectric layer, the first bump pad comprising copper; and
a first seed layer disposed on the curved surface of the first bump pad,
wherein the first bump pad has a first width at the top surface of the first bump pad and has a second width at a portion surrounded by the second dielectric layer, and the second with is greater than the first width,
wherein the second dielectric layer has a top surface, and the top surface of the first bump pad is not protruded from the top surface of the second dielectric layer.

2. The semiconductor substrate of claim 1, wherein the first patterned conductive layer and the first bump pad are configured as an integrated component.

3. The semiconductor substrate of claim 1, wherein the first patterned conductive layer has a third width, and the second width is greater than the first width.

4. The semiconductor substrate of claim 1, wherein the top surface of the first bump pad and the top surface of the second dielectric layer are substantially coplanar.

5. The semiconductor substrate of claim 1, wherein the top surface of the first bump pad is recessed from the top surface of the second dielectric layer.

6. The semiconductor substrate of claim 1, wherein the second dielectric layer comprises a photosensitive dielectric material.

7. The semiconductor substrate of claim 1 further comprising:
a second seed layer disposed on a side surface of the first patterned conductive layer.

8. The semiconductor substrate of claim 7, wherein a thickness of the first seed layer is greater than the thickness of the second seed layer.

9. The semiconductor substrate of claim 1, further comprising:
a second patterned conductive layer disposed in the first dielectric layer;
a second bump pad disposed in the second dielectric layer, the second bump pad electrically connected to the second patterned conductive layer, the second bump pad having a curved surface surrounded by the second dielectric layer;

a third patterned conductive layer disposed in the first dielectric layer; and a fourth patterned conductive layer disposed in the first dielectric layer;

wherein the third patterned conductive layer and the fourth patterned conductive layer are disposed between the first patterned conductive layer and the second patterned conductive layer, and a width between the first bump pad and the second bump pad is smaller than 60 micrometers (μm).

10. The semiconductor substrate of claim 9, wherein the first patterned conductive layer, the second patterned conductive layer, the third patterned conductive layer, and the fourth patterned conductive layer have a substantially same width.

11. A semiconductor package device, comprising:
a semiconductor substrate, comprising:
a first dielectric layer;
a patterned conductive layer disposed in the first dielectric layer;
a second dielectric layer disposed on the first dielectric layer;
a first bump pad disposed in the second dielectric layer, the first bump pad electrically connected to the patterned conductive layer, the first bump pad having a curved surface surrounded by the second dielectric layer, the first bump pad having a top surface exposed from the second dielectric layer, the first bump pad comprising copper; and
a seed layer disposed on the curved surface of the first bump pad; and
a die, electrically connected to the first bump pad by contacting the top surface of the first bump pad.

12. The semiconductor package device of claim 11, wherein the second dielectric layer has a top surface, and the top surface of the first bump pad is recessed from the top surface of the second dielectric layer.

13. The semiconductor package device of claim 11, wherein the semiconductor substrate further comprises:
a second patterned conductive layer disposed in the first dielectric layer;
a second bump pad disposed in the second dielectric layer, the second bump pad electrically connected to the second patterned conductive layer, the second bump pad having a curved surface surrounded by the second dielectric layer;
a third patterned conductive layer disposed in the first dielectric layer; and
a fourth patterned conductive layer disposed in the first dielectric layer;
wherein the third patterned conductive layer and the fourth patterned conductive layer are disposed between the first patterned conductive layer and the second patterned conductive layer, and a width between the first bump pad and the second bump pad is smaller than 60 micrometers (μm).

14. The semiconductor package device of claim 13, wherein the second dielectric layer has a top surface, the first bump pad has a top surface exposed from the second dielectric layer, the second bump pad has a top surface exposed from the second dielectric layer, the top surface of the first bump pad and the top surface of the second bump pad are recessed from the top surface of the second dielectric layer, and the die comprises:
a first conductive pillar contacting the top surface of the first bump pad; and
a second conductive pillar contacting the top surface of the second bump pad.

15. The semiconductor package device of claim 1, wherein the patterned conductive layer and the bump pad are configured as an integrated component.

16. The semiconductor package device of claim 1, wherein the patterned conductive layer has a first width, the first bump pad has a second width, and the second width is greater than the first width.

17. The semiconductor package device of claim 1, wherein the second dielectric layer comprises a photosensitive dielectric material.

18. A semiconductor substrate, comprising:
a first dielectric layer;
a first patterned conductive layer disposed in the first dielectric layer, the first patterned conductive layer having a first width;
a second patterned conductive layer disposed in the first dielectric layer;
a second dielectric layer in contact with the second patterned conductive layer and disposed on the first dielectric layer so as to define an interface between the second dielectric layer and the first dielectric layer, the interface between the first dielectric layer and the second dielectric layer being substantially coplanar to the second patterned conductive layer;
a bump pad disposed in the second dielectric layer, the bump pad electrically connected to the first patterned conductive layer, the bump pad having:
a curved surface surrounded by the second dielectric layer;
a second width at a top surface of the bump pad; and
a third width at a portion surrounded by the second dielectric layer, wherein the third width is greater than the second width, and the second width is greater than the first width; and
a seed layer disposed on the curved surface of the bump pad.

* * * * *